United States Patent
Fukui et al.

(10) Patent No.: US 10,742,231 B2
(45) Date of Patent: Aug. 11, 2020

(54) COMPRESSION/ENCODING APPARATUS AND METHOD, DECODING APPARATUS AND METHOD, AND PROGRAM

(71) Applicant: Sony Corporation, Tokyo (JP)

(72) Inventors: Takao Fukui, Tokyo (JP); Toru Chinen, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/301,930

(22) PCT Filed: May 10, 2017

(86) PCT No.: PCT/JP2017/017617
§ 371 (c)(1),
(2) Date: Nov. 15, 2018

(87) PCT Pub. No.: WO2017/203976
PCT Pub. Date: Nov. 30, 2017

(65) Prior Publication Data
US 2019/0190537 A1    Jun. 20, 2019

(30) Foreign Application Priority Data

May 24, 2016 (JP) .................................. 2016-103003

(51) Int. Cl.
*H03M 7/32* (2006.01)
*H03M 7/42* (2006.01)
(Continued)

(52) U.S. Cl.
CPC ....... *H03M 7/3028* (2013.01); *G10L 19/0017* (2013.01); *H03M 3/02* (2013.01); *H03M 3/022* (2013.01); *H03M 7/42* (2013.01)

(58) Field of Classification Search
CPC ...... H03M 7/3028; H03M 3/02; H03M 3/022; H03M 7/42; H03M 7/302; H03M 3/30; G10L 19/0017
(Continued)

(56) References Cited

U.S. PATENT DOCUMENTS

| 6,061,007 A | 5/2000 | Eastty et al. |
| 6,078,621 A | 6/2000 | Eastty et al. |

(Continued)

FOREIGN PATENT DOCUMENTS

| EP | 845867 A2 | 6/1998 |
| EP | 845868 A2 | 6/1998 |

(Continued)

OTHER PUBLICATIONS

International Search Report and English translation thereof dated Aug. 1, 2017 in connection with International Application No. PCT/JP2017/017617.

(Continued)

*Primary Examiner* — Khai M Nguyen
(74) *Attorney, Agent, or Firm* — Wolf, Greenfield & Sacks, P.C.

(57) ABSTRACT

The present disclosure relates to a compression/encoding apparatus and method, a decoding apparatus and method, and a program that allow for provision of a lossless compression technology with higher compression ratio.
A GOB data configuration section configures GOB data with a group of digital data that includes a plurality of blocks by treating a frame of delta-sigma-modulated digital data as a block. A table generation section generates a conversion table for encoding the GOB data. An encoding section compresses and encodes the digital data of each block included in the GOB data by using the conversion table. The
(Continued)

present technology is applicable, for example, to audio signal compression and encoding, and so on.

12 Claims, 20 Drawing Sheets

(51) Int. Cl.
*H03M 3/02* (2006.01)
*G10L 19/00* (2013.01)

(58) Field of Classification Search
USPC .......................................... 341/143, 87, 51
See application file for complete search history.

(56) References Cited

U.S. PATENT DOCUMENTS

| | | | |
|---|---|---|---|
| 6,269,338 B1 | 7/2001 | Bruekers et al. | |
| 6,286,020 B1 | 9/2001 | Eastty et al. | |
| 6,289,306 B1* | 9/2001 | Van Der Vleuten | G11B 20/00007 704/219 |
| 6,778,965 B1 | 8/2004 | Bruekers et al. | |
| 6,819,275 B2* | 11/2004 | Reefman | G11B 20/00007 341/143 |
| 8,417,730 B2* | 4/2013 | Jones | H03M 7/3084 341/106 |
| 9,626,981 B2* | 4/2017 | Chesney | H03M 3/424 |
| 2001/0003165 A1 | 6/2001 | Van Der Vleuten et al. | |
| 2001/0041984 A1 | 11/2001 | Van Der Vleuten | |
| 2002/0159604 A1 | 10/2002 | Eastty et al. | |
| 2004/0225496 A1 | 11/2004 | Bruekers et al. | |
| 2018/0115322 A1 | 4/2018 | Fukui | |

FOREIGN PATENT DOCUMENTS

| | | |
|---|---|---|
| EP | 3267587 A1 | 1/2018 |
| EP | 3 438 976 A1 | 2/2019 |
| JP | 5-75477 A | 3/1993 |
| JP | 7-264417 A | 10/1995 |
| JP | 9-74358 A | 3/1997 |
| JP | 11-88180 A | 3/1999 |
| JP | 2000-502539 A | 2/2000 |
| JP | 2001-111432 A | 4/2001 |
| WO | WO 1998/016014 A1 | 4/1998 |
| WO | WO 1998/056116 A2 | 12/1998 |
| WO | WO 2016/140071 A1 | 9/2016 |

OTHER PUBLICATIONS

Extended European Search Report dated May 10, 2019 in connection with European Application No. 17802571.4.
Janssen et al., DSD compression for recent ultra high quality 1-bit decoders, Audio Engineering Society (AES) Convention, May 28, 2005, pp. 1-10.
Tatlas et al., Digital Loudspeaker Arrays driven by 1-bit signals, Audio Engineering Society (AES) Convention, May 8, 2004, pp. 1-9.
Written Opinion and English translation thereof dated Aug. 1, 2017 in connection with International Application No. PCT/JP2017/017617.
International Preliminary Report on Patentability and English translation thereof dated Dec. 6, 2018 in connection with International Application No. PCT/JP2017/017617.

* cited by examiner

FIG.3

```
pretable[4096][16]=
{369a, 0, 0, 0, 0, 0, 0, 0, 0, 0, 0, 0, 0, 0, 0, 0},
{0, 0, 0, 0, 0, 0, 0, 0, 0, 0, 0, 0, 0, 0, 0, 0},
……
{0, 1, 10, 18, 20, 31, 11, 0, 4, 12, 5, 0, 0, 0, 0, 0},  ← 118TH ROW
…
```

FIG.4

```
table1[4096][3]=
{00, ff, ff},
{ff, ff, ff},
……
{05, 04, 03},  ← 118TH ROW
…
```

FIG. 8

| Syntax | No. of bits | Data format |
|---|---|---|
| DSD_lossless_payload() {<br>  format_version<br>  DSD_lossless_gob_configuration()<br>  DSD_lossless_gob(number_of_audio_data*)<br>} | 8 | uimsbf |

FIG. 9

| Syntax | No. of bits | Data format |
|---|---|---|
| DSD_lossless_gob_configuration() { | | |
|   channel_configuration | 8 | uimsbf |
|   number_of_blocks | 16 | uimsbf |
|   sampling_frequency | 32 | uimsbf |
|   comment_flag | 8 | uimsbf |
|   if(comment_flag & 0x01)) { | | |
|     comment_size | 32 | uimsbf |
|     for(i=0;i<comment_size;i++){ | | |
|       comment_byte[i] | 8 | |
|     } | | |
|   } | | |
| } | | |

FIG. 10

| Syntax | No. of bits | Data format |
|---|---|---|
| DSD_lossless_gob() {<br>　DSD_lossless_gob_header();<br>　if(DSD_lossless_block_info & 0x80000000)<br>　　DSD_lossless_gob_data();<br>　for(j=0; j<number_of_blocks; j++){<br>　　DSD_lossless_block();<br>　　byte_align();<br>　}<br>} | | |

FIG. 11

| Syntax | No. of bits | Data format |
|---|---|---|
| DSD_lossless_gob_header () {<br>  DSD_lossless_block_info<br>} | 32 | uimsbf |

FIG. 12

| Syntax | No. of bits | Data format |
|---|---|---|
| DSD_lossless_gob_data ( ) {<br>  gob_codebook_length<br>  for (i=0; i<gob_codebook_length; i++) {<br>    gob_codebook[i]<br>  }<br>} | <br>16<br><br>8 | <br>uimsbf<br><br>uimsbf |

FIG. 14

| Syntax | No. of bits | Data format |
|---|---|---|
| DSD_lossless_block() {<br>  for(i=0;i<channel_configuration;i++) {<br>    DSD_frame_header();<br>    for(j=0;j<frame_length_index;j++) {<br>      frame_data[j]<br>    }<br>  }<br>} | 8 | uimsbf |

FIG. 15

| Syntax | No. of bits | Data format |
|---|---|---|
| DSD_frame_header () { | | |
|   sync_word | 16 | uimsbf |
|   channel_id | 3 | uimsbf |
|   frame_length_index | 12 | uimsbf |
|   comp_flag | 1 | uimsbf |
| } | | |

COMPRESSION/ENCODING APPARATUS AND METHOD, DECODING APPARATUS AND METHOD, AND PROGRAM

CROSS-REFERENCE TO RELATED APPLICATIONS

This application claims the benefit under 35 U.S.C. § 371 as a U.S. National Stage Entry of International Application No. PCT/JP2017/017617, filed in the Japanese Patent Office as a Receiving Office on May 10, 2017, which claims priority to Japanese Patent Application Number JP2016-103003, filed in the Japanese Patent Office on May 24, 2016, each of which is hereby incorporated by reference in its entirety.

TECHNICAL FIELD

The present disclosure relates to a compression/encoding apparatus and method, a decoding apparatus and method, and a program, and more particularly, to a compression/encoding apparatus and method, a decoding apparatus and method, and a program that allow for provision of a lossless compression technology with higher compression ratio.

BACKGROUND ART

Recent years have seen the emergence of music delivery using high resolution sound sources, audio data that offer higher quality than music CDs (CD-DAs). Lossless compression technologies such as FLAC (Free Lossless Audio Codec) are available for PCM (Pulse Code Modulation) sound sources including 96 kHz/24 bit and have found application for delivery.

For a one-bit delta-sigma-modulated digital signal (DSD (Direct Stream Digital) data) rather than a PCM digital signal, on the other hand, a lossless compression technology called DST (Direct Stream Transfer) developed by Philips is available and used to create a Super Audio CD (SACD) disc.

However, this technology is based on one-bit signal processing and is not fit for software processing using a CPU that is based on byte-by-byte processing. Therefore, this technology is implemented in hardware (LSI) in SACD players and so on. It is difficult for an ordinary embedded CPU to handle processing using software due to a heavy processing load.

Therefore, in the case where audio signals are delivered using DSD data, a lossless compression technology is required that allows even an ordinary embedded CPU to handle processing in consideration of execution by a mobile terminal.

The present applicant has proposed, as an audio signal lossless compression technology using DSD data, a technology for referring to past data, four bits by four bits, and compressing current data into two bits in PTL 1.

CITATION LIST

Patent Literature

[PTL 1]
Japanese Patent Laid-Open No. H9-74358

SUMMARY

Technical Problem

However, the technique disclosed in PTL 1 does not offer a particularly high data compression ratio, and a lossless compression technology that offers a higher compression ratio is required.

The present disclosure has been made in the light of such a situation, and is intended to provide a lossless compression technology that offers a higher compression ratio.

Solution to Problem

A compression/encoding apparatus of a first aspect of the present disclosure includes a GOB data configuration section, a table generation section, and an encoding section. The GOB data configuration section configures GOB data with a group of digital data that includes a plurality of blocks by treating a frame of delta-sigma-modulated digital data as a block. The table generation section generates a conversion table for encoding the GOB data. The encoding section compresses and encodes the digital data of each block included in the GOB data by using the conversion table.

A compression/encoding method of the first aspect of the present disclosure includes a step in which a compression/encoding apparatus configures GOB data with a group of digital data that includes a plurality of blocks by treating a frame of delta-sigma-modulated digital data as a block, generates a conversion table for encoding the GOB data, and compresses and encodes the digital data of each block included in the GOB data by using the conversion table.

A program of the first aspect of the present disclosure causes a computer to function as a GOB data configuration section, a table generation section, and an encoding section. The GOB data configuration section configures GOB data with a group of digital data that includes a plurality of blocks by treating a frame of delta-sigma-modulated digital data as a block. The table generation section generates a conversion table for encoding the GOB data. The encoding section compresses and encodes the digital data of each block included in the GOB data by using the conversion table.

In the first aspect of the present disclosure, GOB data are configured with a group of digital data that includes a plurality of blocks by treating a frame of delta-sigma-modulated digital data as a block, a conversion table is generated for encoding the GOB data, and the digital data of each block included in the GOB data are compressed and encoded by using the conversion table.

A decoding apparatus of a second aspect of the present disclosure includes a data acquisition section and a decoding section. The data acquisition section acquires compressed GOB data that include a conversion table and compressed data or uncompressed data. The conversion table has been used for encoding GOB data that include a group of digital data including a plurality of blocks by treating a frame of delta-sigma-modulated digital data as a block. The compressed data have been obtained by compressing and encoding the digital data in each block of the GOB data by using the conversion table. The decoding section decodes, in the case where the digital data in each block of the compressed GOB data are the compressed data, the compressed data by using the conversion table.

A decoding method of the second aspect of the present disclosure includes a step in which a decoding apparatus acquires compressed GOB data that include a conversion table and compressed data or uncompressed data. The conversion table has been used for encoding GOB data that include a group of digital data including a plurality of blocks by treating a frame of delta-sigma-modulated digital data as a block. The compressed data have been obtained by compressing and encoding the digital data in each block of the GOB data by using the conversion table. The decoding method includes a step in which the decoding apparatus decodes, in the case where the digital data in each block of the compressed GOB data are the compressed data, the compressed data by using the conversion table.

A program of the second aspect of the present disclosure causes a computer to function as a data acquisition section and a decoding section. The data acquisition section acquires compressed GOB data that include a conversion table and compressed data or uncompressed data. The conversion table has been used for encoding GOB data that include a group of digital data including a plurality of blocks by treating a frame of delta-sigma-modulated digital data as a block. The compressed data have been obtained by compressing and encoding the digital data in each block of the GOB data by using the conversion table. The decoding section decodes, in the case where the digital data in each block of the compressed GOB data are the compressed data, the compressed data by using the conversion table.

In the second aspect of the present disclosure, compressed GOB data are acquired that includes a conversion table and compressed data or uncompressed data. The conversion table has been used for encoding GOB data that include a group of digital data including a plurality of blocks by treating a frame of delta-sigma-modulated digital data as a block. The compressed data have been obtained by compressing and encoding the digital data in each block of the GOB data by using the conversion table. The compressed data are decoded by using the conversion table in the case where the digital data in each block of the compressed GOB data are the compressed data.

It should be noted that a program can be provided by transmitting it through a transmission medium or by recording it on a recording medium.

The compression/encoding apparatus and the decoding apparatus may be independent apparatuses or may be internal blocks included in a single apparatus.

Advantageous Effect of Invention

According to the first and second aspects of the present disclosure, it is possible to provide a lossless compression technology with higher compression ratio.

It should be noted that the effects described herein are not necessarily limited and may be any one of the effects described in this disclosure.

BRIEF DESCRIPTION OF DRAWINGS

FIG. 3 is a diagram describing a preparation method of a data occurrence count table.

FIG. 4 is a diagram describing a conversion table.

FIG. 8 is a diagram illustrating a syntax example of DSD_lossless_payload( ).

FIG. 9 is a diagram illustrating a syntax example of DSD_lossless_gob_configuration( ).

FIG. 10 is a diagram illustrating a syntax example of DSD_lossless_gob( ).

FIG. 11 is a diagram illustrating a syntax example of DSD_lossless_gob header( ).

FIG. 12 is a diagram illustrating a syntax example of DSD_lossless_gob data( ).

FIG. 14 is a diagram illustrating a syntax example of DSD_lossless_block( ).

FIG. 15 is a diagram illustrating a syntax example of DSD_frame_header( ).

DESCRIPTION OF EMBODIMENT

A description will be given below of a mode for carrying out the present technology (hereinafter referred to as an embodiment). It should be noted that the description will be given in the following order:

1. Compression/encoding apparatus (apparatus for generating and compressing and encoding DSD data)
2. Decoding apparatus (apparatus for decoding DSD data that have been compressed and encoded by the compression/encoding apparatus)
3. Computer configuration example <1. Compression/Encoding Apparatus>
<Block Diagram of the Compression/Encoding Apparatus>

Figure 1:
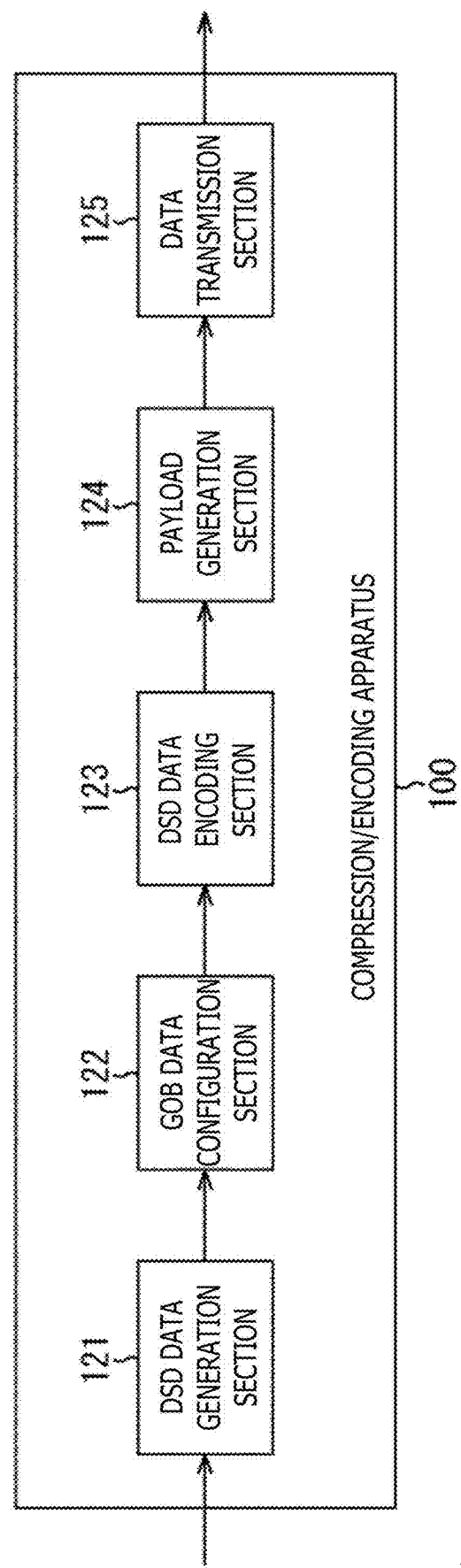
FIG. 1 is a block diagram illustrating a configuration example of a compression/encoding apparatus according to the present disclosure.

FIG. 1 is a block diagram illustrating a configuration example of a compression/encoding apparatus according to the present disclosure.

A compression/encoding apparatus 100 illustrated in FIG. 1 converts an analog audio signal into a digital signal through sigma-delta modulation, compresses and encodes the converted audio signal, and outputs the compressed and encoded signal.

The compression/encoding apparatus 100 includes a DSD data generation section 121, a GOB data configuration section 122, a DSD data encoding section 123, a payload generation section 124, and a data transmission section 125.

The DSD data generation section 121 generates DSD data, a digital signal delta-sigma-modulated by a one-bit signal, by digitizing (performing A/D conversion on) an input analog audio signal through sigma-delta modulation, and outputs DSD data to the GOB data configuration section 122.

The GOB data configuration section 122 treats a frame of DSD data supplied from the DSD data generation section 121 as a block and configures a group (GOB: Group of Blocks) of DSD data using a plurality of blocks of DSD data. Then, the GOB data configuration section 122 outputs a group of configured DSD data (hereinafter also referred to as GOB data) to the DSD data encoding section 123.

Here, one frame is a unit that divides an audio signal into given time intervals (time periods) and regards each as a chunk. In the present embodiment, 131072 bits worth of data whose reproduction time is 46 milliseconds is one frame. Also, one-frame audio signal includes R-channel and L-channel stereo (two-channel) audio signal.

The DSD data generation section 121 converts an analog signal into a one-bit digital signal, for example, at a sampling frequency (2.8 MHz) 64 times the CD sampling frequency 44.1 kHz used for Super Audio CD (SACD). The GOB data configuration section 122 divides that 2.8 MHz DSD data into frame units, treats each unit as a block, and puts together the blocks into units of 10 blocks each. Then, the GOB data configuration section 122 outputs GOB data including 10 blocks of DSD data to the DSD data encoding section 123.

The DSD data encoding section 123 compresses and encodes the GOB data supplied from the GOB data configuration section 122 and outputs compressed encoded data to the payload generation section 124. Although compression and encoding performed by the DSD data encoding section 123 will be described in detail later, the DSD data encoding section 123 performs lossless compression (reversible compression) of GOB data that include 10 blocks of DSD data on a block-by-block basis.

The payload generation section 124 generates a DSD lossless payload from the compressed encoded data supplied from the DSD data encoding section 123 and outputs the DSD lossless payload to the data transmission section 125. The DSD lossless payload includes compressed data obtained by reversibly compressing each block of DSD data, a conversion table table1 used for compression and encoding thereof, and so on as will be described later.

DSD lossless payloads obtained by compressing and encoding a group (GOB) of DSD data are successively supplied from the payload generation section 124. The data transmission section 125 transmits a DSD lossless stream including a plurality of DSD lossless payloads to other apparatus (reception apparatus), for example, in a stream delivery format compliant with the MPEG-DASH (Moving Picture Experts Group phase—Dynamic Adaptive Streaming over HTTP) standard.

<Detailed Configuration Block Diagram>

Figure 2:
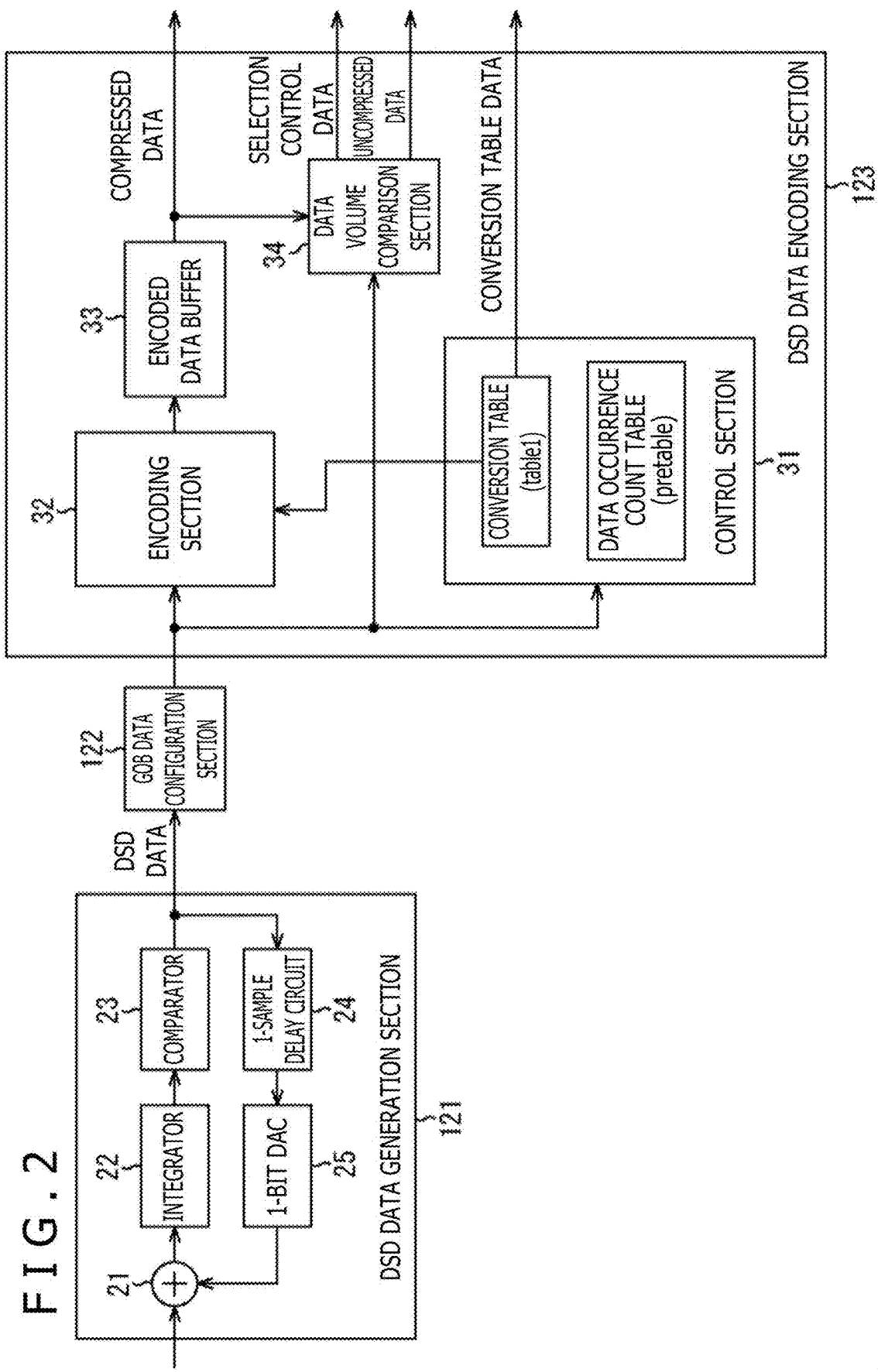
FIG. 2 is a block diagram illustrating detailed configurations of a DSD data generation section and a DSD data encoding section.

FIG. 2 is a block diagram illustrating detailed configurations of the DSD data generation section 121 and the DSD data encoding section 123. It should be noted that FIG. 2 also illustrates the GOB data configuration section 122.

The DSD data generation section 121 includes an adder 21, an integrator 22, a comparator 23, a one-sample delay circuit 24, and a one-bit DAC 25.

An input analog audio signal is supplied to the adder 21. The adder 21 adds up a one-sample-period-old analog audio signal supplied from the one-bit DAC 25 and the input audio signal and outputs the resultant signal to the integrator 22.

The integrator 22 integrates the audio signal from the adder 21 and outputs the resultant signal to the comparator 23. The comparator 23 performs one-bit quantization by comparing the integrated audio signal with a midpoint of the input audio signal. As a sampling period frequency (sampling frequency), a frequency 64 or 128 times 48 kHz or 44.1 kHz, a conventional frequency, is used. The comparator 23 outputs the one-bit quantized audio signal to the GOB data configuration section 122 and supplies the one-bit quantized audio signal to the one-sample delay circuit 24.

The one-sample delay circuit 24 delays the audio signal from the comparator 23 by one sample period and outputs the delayed signal to the one-bit DAC 25. The one-bit DAC 25 converts the digital signal from the one-sample delay circuit 24 into an analog signal and outputs the analog signal to the adder 21.

The DSD data generation section 121 configured as described above converts the input audio signal into a one-bit digital signal (performs A/D conversion) and outputs the one-bit digital signal to the GOB data configuration section 122. This A/D conversion through sigma-delta modulation allows for a digital audio signal with a wide dynamic range to be acquired even in the case of a small bit count such as one bit by increasing the sampling period frequency (sampling frequency) to a sufficiently high level.

In the present embodiment, a stereo (two-channel) audio signal is input to the DSD data generation section 121, and the DSD data generation section 121 performs A/D conversion at a sampling frequency 64 times 44.1 kHz to convert the audio signal into a one-bit signal (DSD data) and outputs the resultant signal to the GOB data configuration section 122.

It should be noted that the quantization bit count may be two bits or four bits in sigma-delta modulation.

The GOB data configuration section 122 temporarily accumulates the DSD data supplied from the DSD data generation section 121 and supplies the DSD data, GOB by GOB, to the DSD data encoding section 123 at the subsequent stage. As described above, a GOB includes, for example, 10 blocks, and one block is, for example, 131072 bits worth of data whose reproduction time is 46 milliseconds. It should be noted that, needless to say, the number of blocks included in a GOB and the number of bits of DSD data included in one block are not limited thereto, and desired values can be specified.

The DSD data encoding section 123 has a control section 31, an encoding section 32, an encoded data buffer 33, and a data volume comparison section 34.

The control section 31 controls the overall operation of the DSD data encoding section 123. Also, the control section 31 has a function to prepare the conversion table table1 necessary for compression and encoding handled by the encoding section 32 and supply the conversion table to the encoding section 32.

Specifically, the control section 31 prepares a data occurrence count table pretable by using the GOB data supplied from the GOB data configuration section 122 and further prepares the conversion table table1 from the data occurrence count table pretable. The control section 31 supplies the prepared conversion table table1 to the encoding section 32 and the payload generation section 124 at the subsequent stage. The conversion table table1 is prepared (updated), GOB by GOB, and supplied to the encoding section 32 and the payload generation section 124.

The encoding section 32 compresses and encodes, four bits by four bits, each block of DSD data supplied from the GOB data configuration section 122, by using the conversion table table1 supplied from the control section 31. Therefore, GOB data (10 blocks of DSD data) are supplied to the encoding section 32 from the GOB data configuration section 122 simultaneously with the supply of GOB data to the control section 31. However, the encoding section 32 does not proceed with compression and encoding until the conversion table table1 is supplied from the control section 31.

Although compression and encoding will be described in detail later with reference to FIGS. 3 to 5, the encoding section 32 encodes four-bit DSD data into two-bit data or six-bit data and outputs the encoded data to the encoded data buffer 33.

The encoded data buffer 33 temporarily buffers the compressed data, DSD data compressed and encoded by the encoding section 32 and supplies the data to the data volume comparison section 34 and the payload generation section 124.

The data volume comparison section 34 compares, block by block, the DSD data (hereinafter also referred to as uncompressed data) supplied from the GOB data configuration section 122 with the compressed data supplied from the encoded data buffer 33 in terms of data volume (degree of compression). The reason for this is that because the encoding section 32 encodes four-bit DSD data into two-bit data or six-bit data as described above, there is a possibility that a post-compression data volume may exceeds a pre-compression data volume in an algorithm. Therefore, the data volume comparison section 34 compares compressed data and uncompressed data in terms of data volume, selects the one with a smaller data volume, and supplies selection control data indicating which has been selected to the payload generation section 124. It should be noted that in the case where the data volume comparison section 34 supplies, to the payload generation section 124, selection control data indicating that uncompressed data have been selected, the data volume comparison section 34 also supplies uncompressed data to the payload generation section 124. It can be said that selection control data are, as viewed from the apparatus on the receiving side of transmission data, a flag indicating whether or not audio data sent from the payload generation section 124 is data compressed and encoded by the encoding section 32.

Data (compressed or uncompressed) of each of the 10 blocks included in the GOB, selection control data indicating whether the data are compressed or uncompressed, and the conversion table table1 used for the 10 blocks included in the GOB are supplied to the payload generation section 124 from the DSD data encoding section 123 configured as described above.

<Description of the DSD Data Compression/Encoding Scheme>

A description will be given next of DSD data compression and encoding handled by the DSD data encoding section 123 with reference to FIGS. 3 to 5.

<Preparation Method of the Data Occurrence Count Table>

A description will be given first of the method by which the control section 31 prepares the data occurrence count table pretable.

The control section 31 prepares the data occurrence count table pretable for GOB-by-GOB DSD data and expresses the GOB-by-GOB DSD data supplied from the GOB data configuration section 122, four bits by four bits, as depicted below.

... D4[n−3], D4[n−2], D4[n−1], D4[n], D4[n+1], D4[n+2], D4[n+3] ....

where D4[n] represents four-bit continuous data and will be hereinafter also referred to as D4 data (n>3).

The control section 31 counts the number of occurrences of D4 data following the past three pieces of D4 data (past 12-bit data) and prepares a data occurrence count table pretable[4096][16] illustrated in FIG. 3. Here, "[4096]" and "[16]" in the data occurrence count table pretable[4096][16] indicate that the data occurrence count table pretable is a table (matrix) with 4096 rows by 16 columns, and each of rows [0] to [4095] corresponds to the value which can be taken on by the past three pieces of D4 data (past bit pattern), and each of columns [0] to [15] corresponds to the value which can be taken on by the next D4 data.

Specifically, pretable[0][0] to [0][15], the first row of the data occurrence count table pretable, indicates the number of occurrences of next data when D4[n−3], D4[n−2], and D4[n−1], the past three pieces of D4 data, were "0"={0000, 0000,0000} and indicates that the number of times the four bits following the past three pieces of data having "0" were "0" was 369a (HEX notation) and that there was no other data.

pretable[1][0] to [1][15], the second row of the data occurrence count table pretable, indicates the number of occurrences of next data when D4[n−3], D4[n−2], and D4[n−1], the past three pieces of D4 data, were "1"={0000, 0000,0001}. The fact that all the elements in the second row of the data occurrence count table pretable are "0" indicates that three pieces of D4 data having "1" as past data did not exist in this one frame.

Also, in FIG. 3, pretable[117][0] to [117][15], the 118th row of the data occurrence count table pretable, indicates the number of occurrences of next data when D4[n−3], D4[n−2], and D4[n−1], the past three pieces of D4 data, were "117"={0000,0111,0101}. This data indicate that the number of times the four bits following the past three pieces of data having "117" were "0" was 0, that the number of times the four bits were "1" was 1, that the number of times the four bits were "2" was 10, that the number of times the four bits were "3" was 18, that the number of times the four bits were "4" was 20, that the number of times the four bits were "5" was 31, that the number of times the four bits were "6" was 11, that the number of times the four bits were "7" was 0, that the number of times the four bits were "8" was 4, that the number of times the four bits were "9" was 12, that the number of times the four bits were "10" was 5, and that the number of times the four bits were one of "11" to "15" was 0.

The control section 31 counts the number of occurrences of D4 data following past three pieces of D4 data (past 12-bit data) for a frame of DSD data and prepares the data occurrence count table pretable as described above.

<Preparation Method of the Conversion Table>

A description will be given next of the method by which the control section 31 prepares the conversion table table1.

The control section 31 prepares a conversion table table1 [4096][3] with 4096 rows by three columns on the basis of the data occurrence count table pretable prepared earlier. Here, each of rows [0] to [4095] of the conversion table table1[4096][3] corresponds to the value which can be taken on by the past three pieces of D4 data, and columns [0] to [2] store, of the 16 values which can be taken on by the next D4 data, the three most frequent values. The first column [0] of the conversion table table1[4096][3] stores the most frequent value, the second column [1] stores the second most frequent value, and the third column [2] stores the third most frequent value.

FIG. 4 illustrates an example of the conversion table table1[4096][3] corresponding to the data occurrence count table pretable illustrated in FIG. 3.

table1[117][0] to [117][2] in the 118th row of the conversion table table1[4096][3] reads {05,04,03}. This corresponds to the contents of pretable[117][0] to [117][15] in the 118th row of the data occurrence count table pretable illustrated in FIG. 3.

The most frequent value in pretable[117][0] to [117][15] in the 118th row of the data occurrence count table pretable illustrated in FIG. 3 is "5" which occurred 31 times, the second most frequent value is "4" which occurred 20 times, and the third most frequent value is "3" which occurred 18 times. As a result, {05} is stored in table1[117][0] in the 118th row and first column of the conversion table table1 [4096][3], {04} is stored in table1[117][1] in the 118th row and second column, and {03} is stored in table1[117][2] in the 118th row and third column.

Similarly, table1[0][0] to [0][2] in the first row of the conversion table table1[4096][3] corresponds to the contents of pretable[0][0] to [0][15] in the first row of the data occurrence count table pretable illustrated in FIG. 3.

In pretable[0][0] to [0][15] in the first row of the data occurrence count table pretable illustrated in FIG. 3, the most frequent value is "0" which occurred 369a (HEX notation) times, and no other values occurred. As a result, {00} is stored in table1[0][0] in the first row and first column of the conversion table table1[4096][3], and {ff} indicating the nonexistence of data is stored in table1[0][1] in the first row and second column and in table1[0][2] in the first row and third column. The value representing the nonexistence of data is not limited to {ff} and can be determined as appropriate. The value stored in each element of the conversion table table1 is one of "0" to "15" and, therefore, can be represented with four bits. However, the value is represented with eight bits for easy handling in computer processing.

The conversion table table1[4096][3] with 4096 rows by three columns is prepared as described above on the basis of the data occurrence count table pretable prepared earlier and supplied to the encoding section 32.

<Compression/Encoding Method by the Encoding Section 32>

A description will be given next of the method by which the encoding section 32 performs compression and encoding using the conversion table table1.

For example, the case will be described in which the encoding section 32 encodes, of
... D4[n−3], D4[n−2], D4[n−1], D4[n], D4[n+1], D4[n+2], D4[n+3] ... ,
DSD data supplied from the GOB data configuration section 122, D4[n].

In the case where D4[n] is encoded, the encoding section 32 regards D4[n−3], D4[n−2], D4[n−1], the immediately previous past 12-bit data, as a chunk of 12-bit data and searches for the following three values at the addresses (rows) indicated by D4[n−3], D4[n−2], D4[n−1] of the conversion table table1[4096][3]:
table1[D4[n−3], D4[n−2], D4[n−1]][0];
table1[D4[n−3], D4[n−2], D4[n−1]][1]; and
table1[D4[n−3], D4[n−2], D4[n−1]][2].

The encoding section 32, in the case where any of
table1[D4[n−3], D4[n−2], D4[n−1]][0],
table1[D4[n−3], D4[n−2], D4[n−1]][1], and
table1[D4[n−3], D4[n−2], D4[n−1]][2],
the three values at the addresses (rows) indicated by D4[n−3], D4[n−2], D4[n−1] of the conversion table table1[4096] [3], is the same as D4[n], and
in the case where table1[D4[n−3], D4[n−2], D4[n−1]][0] is the same, converts D4[n] into "01b," two bits,
in the case where table1[D4[n−3], D4[n−2], D4[n−1]][1] is the same, converts D4[n] into "10b," two bits, and
in the case where table1[D4[n−3], D4[n−2], D4[n−1]][2] is the same, converts D4[n] into "11b," two bits.

On the other hand, in the case where none of the three values at the addresses (rows) indicated by D4[n−3], D4[n−2], D4[n−1] of the conversion table table1[4096][3], is the same, the encoding section 32 converts D4[n] into six bits such as "00b+D4[n]" by adding "00b" before D4[n]. Here, 'b' in "01b," "10b," "11b," and "00b+D4[n]" indicates that these are in binary notation.

As described above, the encoding section 32 converts D4[n], four-bit DSD data, into "01b," "10b," or "11b," two-bit data, by using the conversion table table1 or into "00b+D4[n]," six-bit data, first, and then outputs the resultant data to the encoded data buffer 33.

<Detailed Configuration of the Encoding Section 32>

Figure 5:
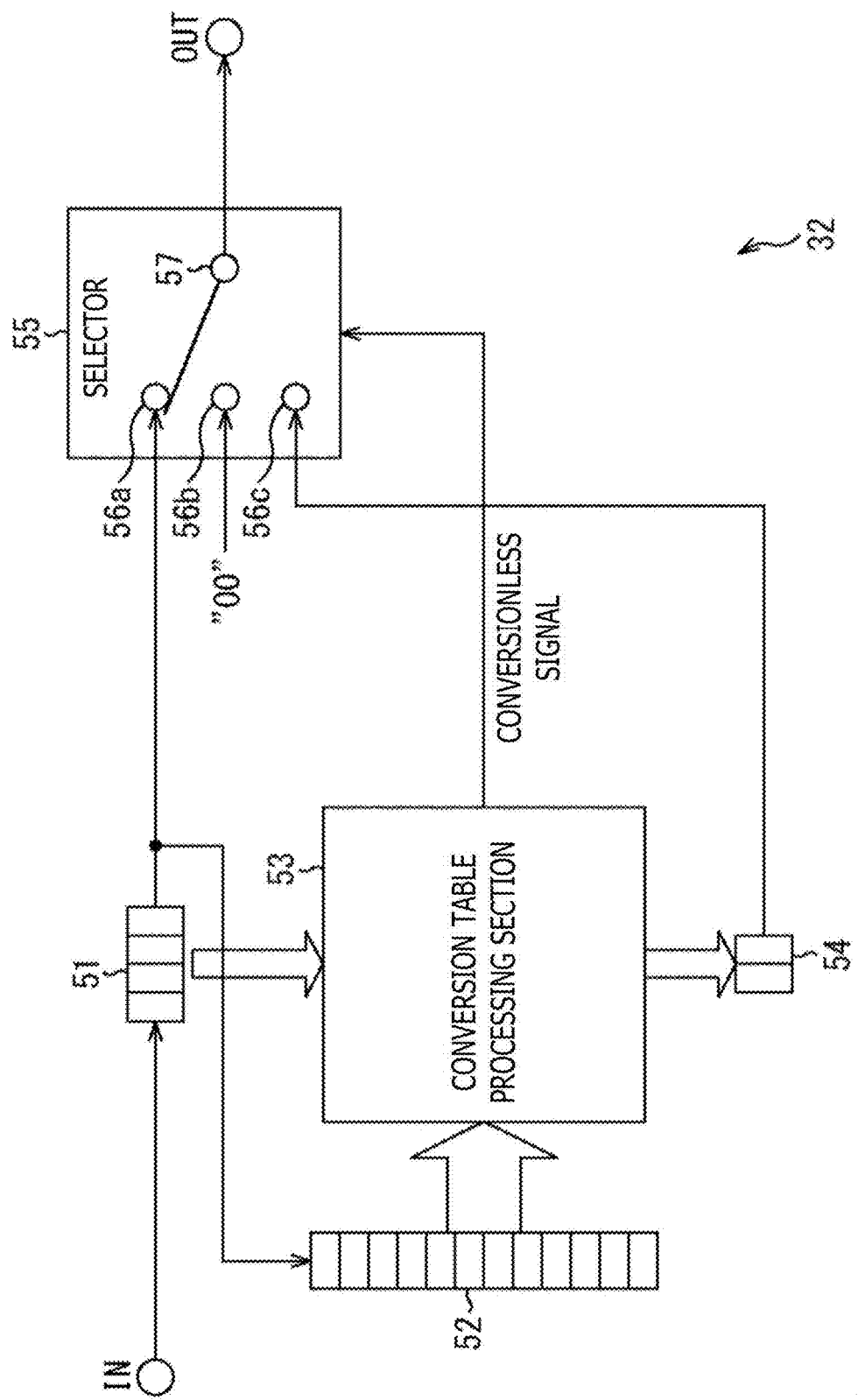
FIG. 5 is a block diagram illustrating a configuration example of an encoding section.

FIG. 5 is a diagram illustrating a configuration example of the encoding section 32 that handles compression and encoding described above.

Four-bit DSD data (e.g., D4[n]) supplied from the GOB data configuration section 122 is stored in a register 51 that holds four bits. Also, an output of the register 51 is connected to an input terminal 56a, one of input terminals of a selector 55, and a register 52 that holds 12 bits. The register 52 holds the past 12-bit data (e.g., D4[n−3], D4[n−2], D4[n−1]) immediately previous to the four-bit DSD data stored in the register 51.

A conversion table processing section 53 has the conversion table table1 supplied from the control section 31.

The conversion table processing section 53 makes a search to determine whether or not the four-bit data (e.g., D4[n]) held in the register 51 is included in three values at the addresses indicated by 12-bit data (e.g., D4[n−3], D4[n−2], D4[n−1]) held in the register 52:
table1[D4[n−3], D4[n−2], D4[n−1]][0];
table1[D4[n−3], D4[n−2], D4[n−1]][1]; and
table1[D4[n−3], D4[n−2], D4[n−1]][2].

In the case where the four-bit data are included, the conversion table processing section 53 stores the value corresponding to the column where the same value is held, i.e., "01b," "10b," or "11b," in a two-bit register 54. Data stored in the two-bit register 54 are supplied to an input terminal 56c, one of input terminals of the selector 55.

On the other hand, in the case where the four-bit data (e.g., D4[n]) held in the register 51 are not included in any of the three values at the addresses indicated by 12-bit data (e.g., D4[n−3], D4[n−2], D4[n−1]) held in the register 52, the conversion table processing section 53 outputs, to the selector 55, a signal indicating that no conversion will be performed (e.g., hereinafter referred to as a conversionless signal).

The selector 55 selects one of three input terminals 56a to 56c and outputs data acquired from the selected input terminal 56 from an output terminal 57.

The input terminal 56a is supplied, for example, with four-bit DSD data (e.g., D4[n]) stored in the register 51, and the input terminal 56b is supplied with "00b," and the input terminal 56c is supplied with two-bit converted data stored in the register 54.

In the case where a conversionless signal indicating that no conversion will be performed is supplied from the conversion table processing section 53, the selector 55 selects the input terminal 56b, outputs "00b" from the output terminal 57, and then, selects the input terminal 56a, and outputs the four-bit DSD data (e.g., D4[n]) stored in the register 51 from the output terminal 57. As a result, "00b+D4[n]," six bits output in the case where none of the values in the conversion table table1 is the same as D4[n], is output from the output terminal 57.

On the other hand, in the case where a conversionless signal indicating that no conversion will be performed is not supplied (in the case where a conversion signal indicating that conversion has been performed is supplied), the selector 55 selects the input terminal 56c and outputs the two-bit converted data supplied from the register 54 from the output terminal 57. As a result, two bits that are output in the case where the same data as D4[n] are included in the conversion table table1, i.e., one of "01b," "10b," and "11b," are output from the output terminal 57.

<Flow of the GOB Data Compression/Encoding Process>

Figure 6:
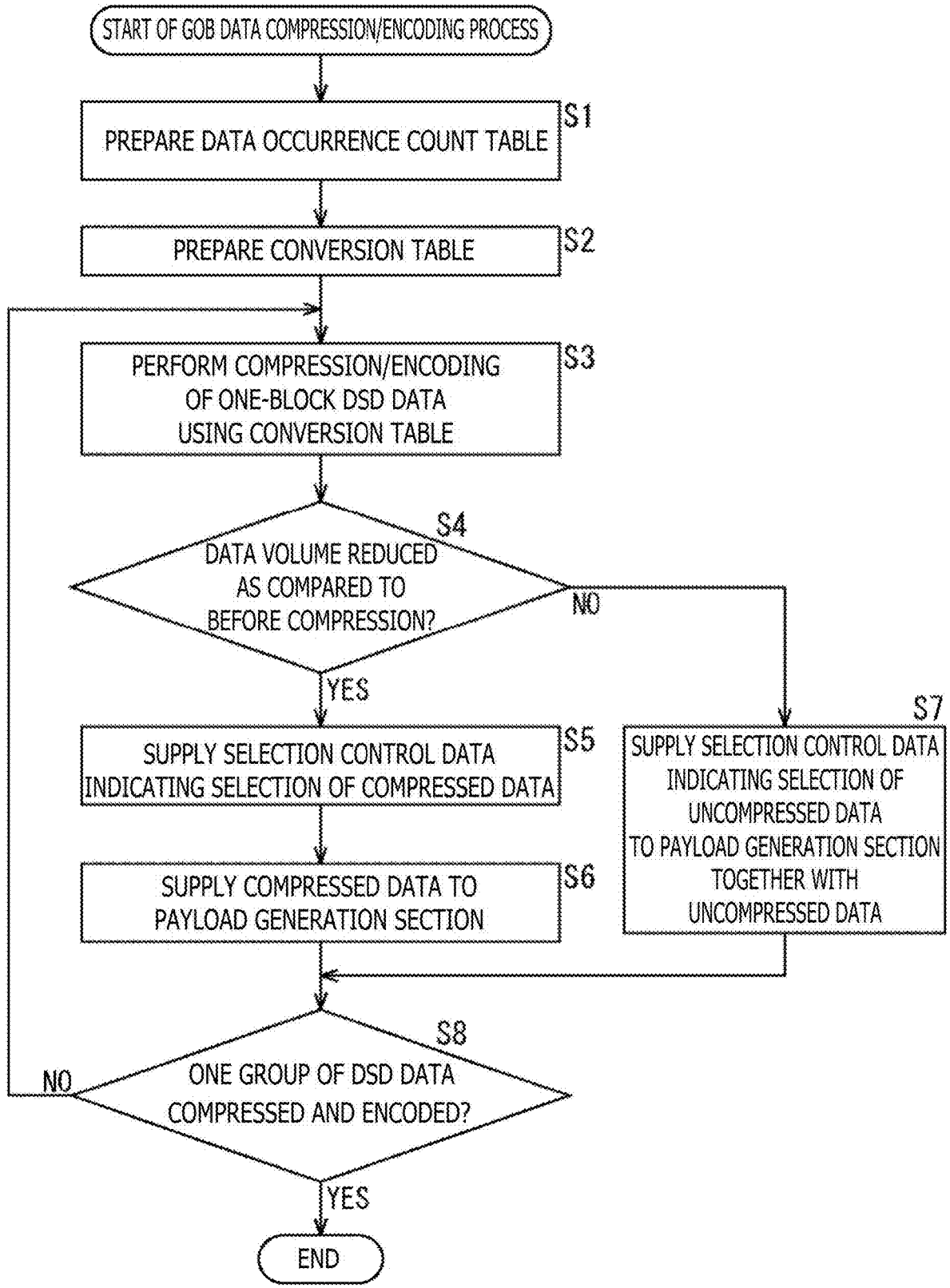
FIG. 6 is a flowchart describing a GOB data compression and encoding process.

A description will be given of a GOB data compression/encoding process handled by the DSD data encoding section 123 with reference to the flowchart illustrated in FIG. 6.

First, in step S1, the control section 31 counts the number of occurrences of D4 data following the past three pieces of D4 data (past 12-bit data) for a group (GOB) of DSD data and prepares a data occurrence count table pretable.

In step S2, the control section 31 prepares the conversion table table1 with 4096 rows by three columns on the basis of the data occurrence count table pretable prepared. The control section 31 supplies the prepared conversion table table1 to the encoding section 32 and the payload generation section 124.

In step S3, the encoding section 32 performs compression and encoding on a block of DSD data by using the conversion table table1. Specifically, the encoding section 32 performs, on a block of DSD data, a process of converting D4[n], four-bit DSD data, into "01b," "10b," or "11b," two-bit data, or into "00b+D4[n]," six-bit data. Compressed data obtained as a result of compression and encoding are supplied to the encoded data buffer 33 and the data volume comparison section 34.

In step S4, the data volume comparison section 34 compares the block of uncompressed data supplied from the GOB data configuration section 122 and the block of compressed data supplied from the encoded data buffer 33 in terms of data volume and decides whether the data volume has been reduced as compared to before the compression.

In the case where it is decided in step S4 that the data volume has been reduced as compared to before the compression, the process proceeds to step S5, and the data volume comparison section 34 supplies, to the payload generation section 124, selection control data indicating that the compressed data have been selected.

In step S6, the encoded data buffer 33 supplies, to the payload generation section 124, compressed data obtained by compressing and encoding a block of DSD data by using the conversion table table1.

On the other hand, in the case where it is decided in step S4 that the data volume has not been reduced as compared to before the compression, the process proceeds to step S7, and the data volume comparison section 34 supplies, together with the uncompressed data to the payload generation section 124, selection control data indicating that the uncompressed data have been selected.

In step S8, the control section 31 decides whether a group (GOB) of DSD data has been compressed and encoded.

In the case where it is decided in step S8 that a group of DSD data has yet to be compressed and encoded, the process returns to step S3, and the above processes in steps S3 to S8 are repeated. That is, the next block of DSD data included in the same GOB is compressed and encoded by using the same conversion table table1.

On the other hand, in the case where it is decided in step S8 that a group of DSD data has been compressed and encoded, the DSD data encoding section 123 terminates the compression/encoding process of GOB data.

<Generation of DSD Lossless Payload>

A description will be given next of generation of a DSD lossless payload handled by the payload generation section 124.

The payload generation section 124 generates a DSD lossless payload for a group (GOB) of compressed data following compression and encoding.

Figure 7:
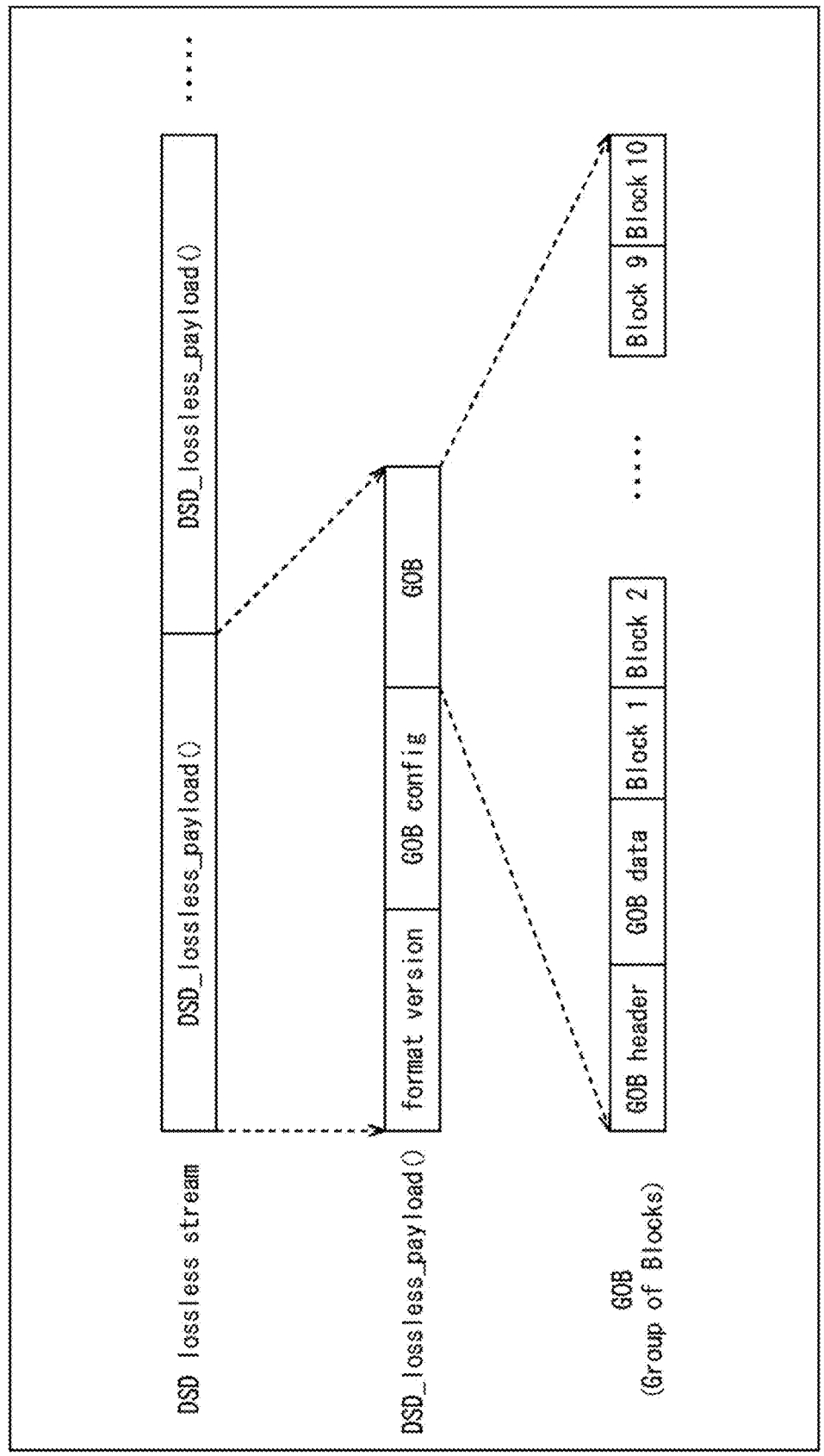
FIG. 7 is a diagram describing a configuration of a DSD lossless payload.

FIG. 7 illustrates a configuration of a DSD lossless payload.

As illustrated at the top row in FIG. 7, a DSD lossless stream corresponding to a piece of content (music) includes a plurality of DSD lossless payloads (DSD_lossless_payload( ).

Then, a DSD lossless payload includes a format version, a GOB config, and a GOB as illustrated at the second row in FIG. 7.

FIG. 8 illustrates a syntax example of a DSD lossless payload (DSD_lossless_payload( )).

The version number of the DSD lossless payload is held in the format version.

It should be noted that, in the syntax examples illustrated in FIG. 8 and subsequent figures, the value under "No. of bits" represents the bit count of that variable, and 'uimsbf' under "Data format" represents unsigned integer most significant bit first.

DSD_lossless_gob_configuration( ) in FIG. 8 corresponds to the GOB config in FIG. 7.

DSD_lossless_gob(number_of_audio_data) in FIG. 8 corresponds to GOB in FIG. 7. number_of_audio_data, an argument of DSD_lossless_gob(number_of_audio_data), is known by DSD_lossless_gob( ) that is sent in advance.

FIG. 9 illustrates a syntax example of GOB config (DSD_lossless_gob_configuration( ) in FIG. 7.

channel_configuration, number of blocks, sampling_frequency, comment_flag, comment_size, comment_byte, and so on are held in GOB config.

The number of channels is defined by channel_configuration. In the present embodiment, 'channel_configuration=2' is used.

The number of blocks included in a group is defined by number of blocks. In the present embodiment, 'number of blocks=10' is used.

The sampling frequency is defined by sampling_frequency. As a sampling frequency, 64 times 44.1 kHz (2822400 Hz), 128 times 44.1 kHz (5644800 Hz), or 256 times 44.1 kHz (11289600 Hz) can be adopted. In the present embodiment, for example, 'sampling_frequency=2822400(44.1K×64)' is used.

The presence or absence of a comment is defined by comment_flag. The comment size is defined by comment_size. The content of the comment is held in comment_byte.

Next, as illustrated at the third row in FIG. 7, GOB includes a GOB header, GOB data, and a plurality of blocks (Block1, Block2, Block3 and so on). In the present embodiment, the number of blocks included in a group is set to 10. Therefore, 10 blocks (Block1 to Block10) are provided.

FIG. 10 illustrates a syntax example of GOB (DSD_lossless_gob(number_of_audio_data)) in FIG. 7.

DSD_lossless_gob header( ) corresponds to GOB header in FIG. 7.

DSD_lossless_gob data( ) corresponds to GOB data in FIG. 7.

DSD_lossless_block( ) corresponds to each block from Block1 to Block10 in FIG. 7.

FIG. 11 illustrates a syntax example of GOB header (DSD_lossless_gob header( )) in FIG. 7.

Whether the DSD lossless stream (DSD lossless stream) as a whole is compressed and encoded, for example, is defined by DSD_lossless_block info.

FIG. 12 illustrates a syntax example of GOB data (DSD_lossless_gob data( )) in FIG. 7.

The number of bytes of gob_codebook is defined by gob_codebook_length.

Data of the conversion table table1 used for compression and encoding of the 10 blocks included in the group are held in gob_codebook[i].

Figure 13:
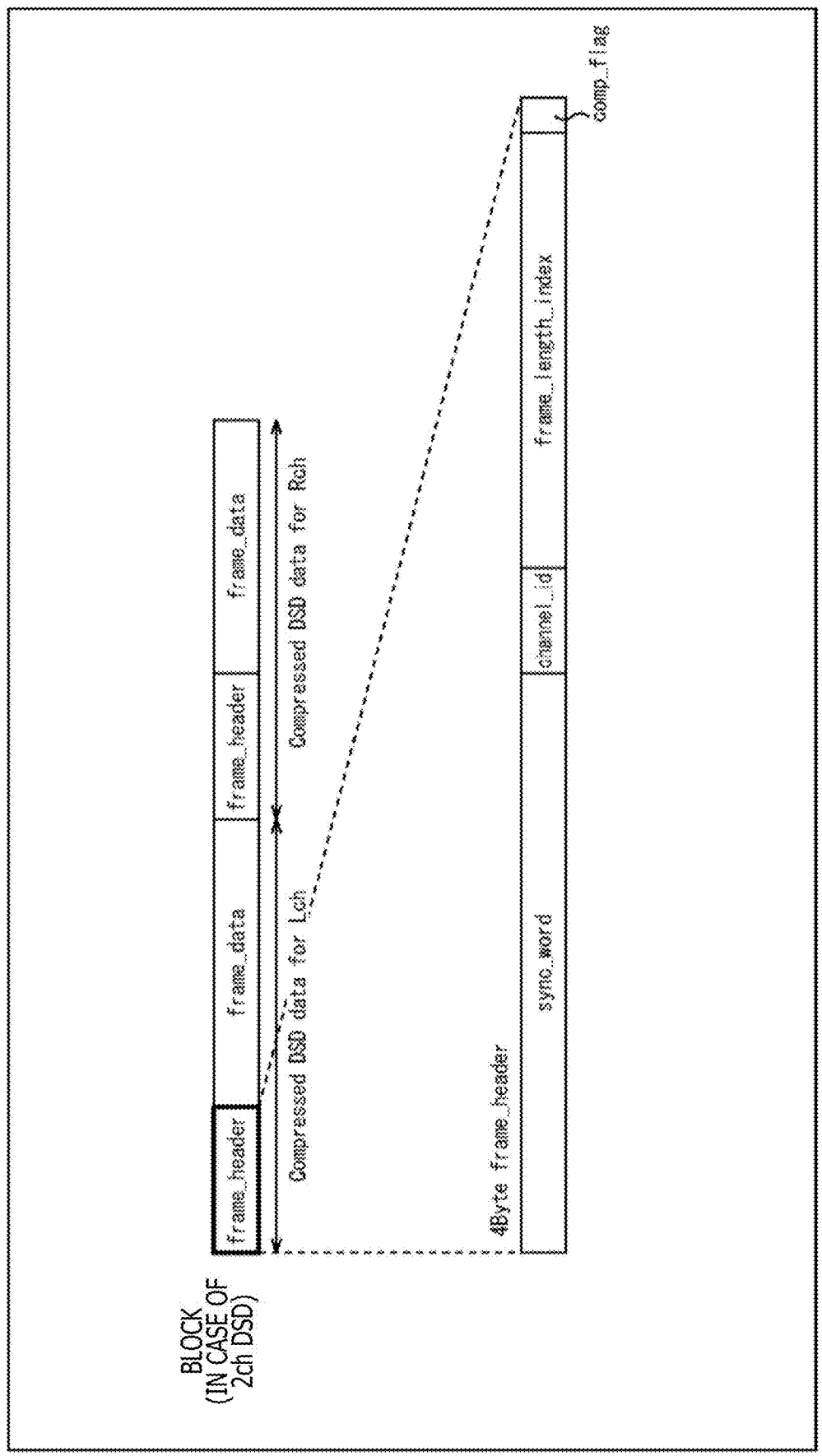
FIG. 13 is a diagram illustrating a configuration of each block.

FIG. 13 illustrates a configuration of each block from Block1 to Block10 in FIG. 7.

As illustrated in FIG. 13, one block holds as many frame headers (frame_header) and pieces of frame data (frame_data) as the number of channels (channel_configuration).

A frame header (frame_header) includes a sync word (sync_word), a channel ID (channel_id), a frame length index (frame_length_index), and a compression flag (comp_flag).

FIG. 14 illustrates a syntax example of each block (DSD_lossless_block( )) in FIG. 7.

DSD_frame_header( ) corresponds to the frame header (frame_header) in FIG. 13.

FIG. 15 illustrates a syntax example of the frame header (DSD_frame_header( )) in FIG. 13.

sync word (sync_word) holds data representing the beginning of the frame header (frame_header) and the frame data (frame_data).

Channel ID (channel_id) holds data representing the channel number of the frame header (frame_header) and the frame data (frame_data).

Frame length index (frame_length_index) holds the number of bytes of the frame data (frame_data). It should be noted that the actual number of bytes is (frame_length_index+1) bytes.

Compression flag (comp_flag) holds data representing whether or not the frame data (frame_data) are compressed and encoded. When comp_flag="1," it indicates that the frame data are compressed. When comp_flag="0," it indicates that the frame data are uncompressed. This flag corresponds to selection control data described above.

Referring back to FIG. 14, frame_data[j] holds compressed or uncompressed data.

The DSD lossless payload is configured as follows:

That is, the DSD lossless payload holds the conversion table table1, generated for a group (GOB) of DSD data that includes a plurality of blocks (Block1 to Block10) together with compressed or uncompressed data of each block included in the group. Also, the DSD lossless payload holds a compression flag (comp_flag) indicating whether the data of each block are compressed data or uncompressed data.

<Flow of the DSD Data Transmission Flow>

Figure 16:
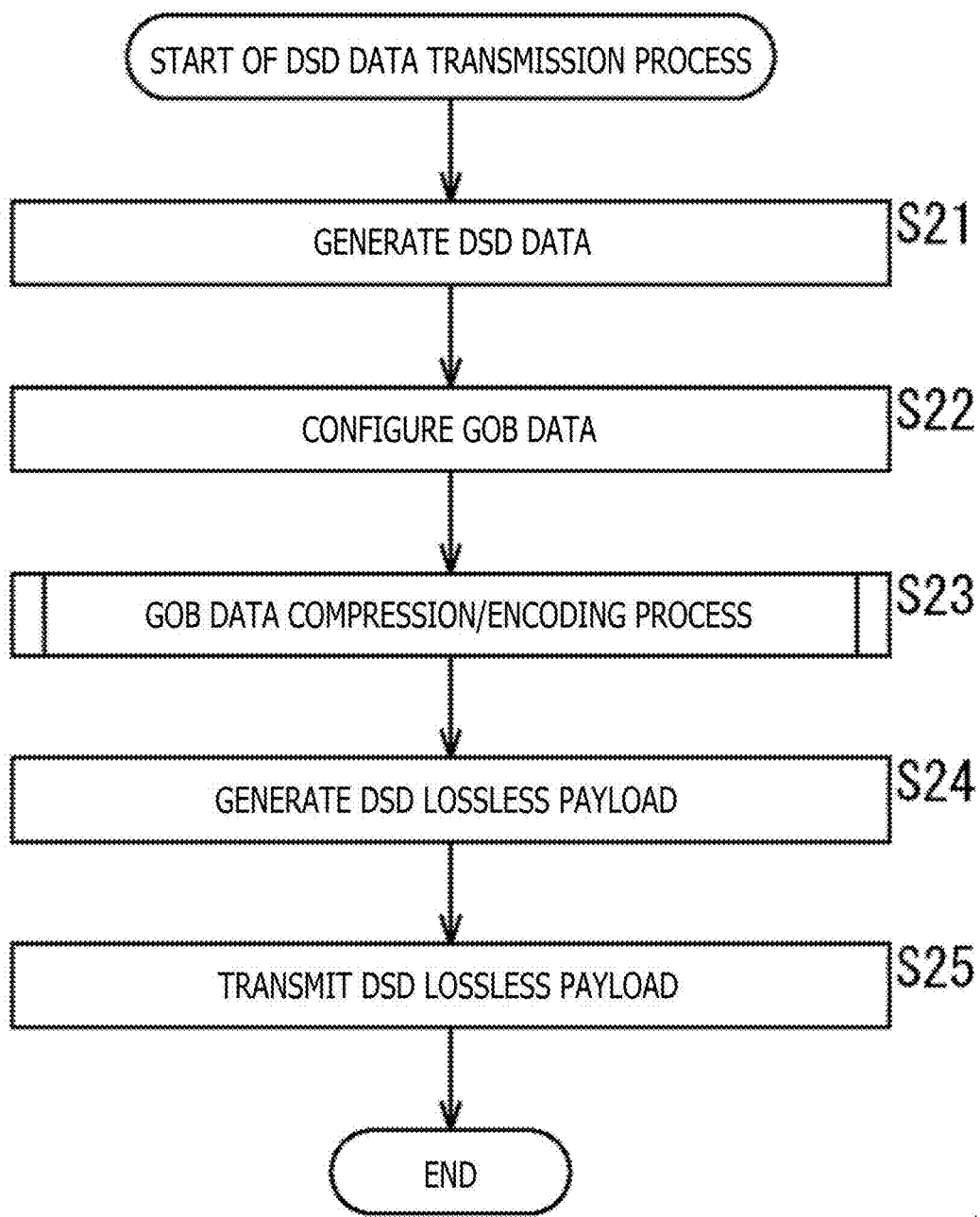
FIG. 16 is a flowchart describing a DSD data transmission process.

A description will be given next of a DSD data transmission process, a process handled by the compression/encoding apparatus 100 as a whole illustrated in FIG. 1 with reference to the flowchart illustrated in FIG. 16.

First, in step S21, the DSD data generation section 121 generates DSD data, a digital signal delta-sigma-modulated by a one-bit signal, by digitizing (performing A/D conversion on) an input analog audio signal through sigma-delta modulation, and outputs DSD data to the GOB data configuration section 122.

In step S22, the GOB data configuration section 122 treats a given unit of DSD data as a block and configures GOB data that include a plurality of blocks of DSD data. In the present embodiment, 131072 bits worth of data whose reproduction time is 46 milliseconds is treated as a block, and GOB data (a group of DSD data) include 10 blocks.

In step S23, the DSD data encoding section 123 performs a GOB data compression/encoding process that compresses and encodes the GOB data supplied from the GOB data configuration section 122. That is, the DSD data encoding section 123 performs the process described with reference to the flowchart illustrated in FIG. 6.

In step S24, the payload generation section 124 generates a DSD lossless payload that holds the compressed or uncompressed data supplied from the DSD data encoding section 123 and outputs the DSD lossless payload to the data transmission section 125. The DSD lossless payload also includes a compression flag (comp_flag) indicating whether the data of each block are compressed data or uncompressed data and the conversion table table1 that was used for compression and encoding.

In step S25, the data transmission section 125 transmits the DSD lossless payload generated in the payload generation section 124 to other apparatus (reception apparatus), for example, in a given stream delivery format such as MPEG-DASH.

The above processes in steps S21 to S25 are repeated until all the audio signals input to the compression/encoding apparatus 100 are processed.

As described above, the compression/encoding apparatus 100 illustrated in FIG. 1 includes the GOB data configuration section 122, the control section 31, and the encoding section 32. The GOB data configuration section 122 treats a frame of delta-sigma-modulated DSD data (digital data) as a block and configures GOB data using a group of DSD data that include a plurality of blocks of DSD data. The control section 31 generates the conversion table table1 for encoding GOB data as a table generation section. The encoding section 32 compresses and encodes each block of the DSD data included in the GOB data by using the conversion table table1.

Also, the compression/encoding apparatus 100 includes the data volume comparison section 34 and the payload generation section 124. The data volume comparison section 34 decides, block by block, the degree of compression of compressed data compressed and encoded by the encoding section 32 as a compression decision section. The payload generation section 124 generates compressed GOB data that adopt DSD data that have yet to be compressed and encoded for a block whose degree of compression is greater than the DSD data before the compression and encoding and that adopt compressed data that have been compressed and encoded for a block whose degree of compression is equal to or smaller than the DSD data before the compression and encoding.

Further, the compression/encoding apparatus 100 further includes the data transmission section 125 that transmits the conversion table table1 and compressed GOB data that use the conversion table table1.

For example, in the case where DSD data of a piece of content were compressed and encoded through the compression/encoding scheme of the present disclosure with the data size of a block of data that has yet to be compressed and encoded set to 32768 bytes, the data size of each block was approximately 24 kbytes, and the data size of the conversion table table1 was 8 kbytes. Therefore, 8 kbyte data of the conversion table table1 are inserted once every 10 transmissions of 24 kbyte block data. It becomes easier to deal with load fluctuations in the transmission channel by reducing the packet size. Also, in the case where the size of compressed data exceeds the size of original data, the transmission capacity as a whole can be reduced by sending the block of data in its original size of 32768 bytes without compressing and encoding the data.

According to the compression/encoding apparatus 100 in FIG. 1, it is possible to generate and provide a DSD lossless stream obtained by lossless compression/encoding of DSD data with a higher compression ratio.

<2. Decoding Apparatus>
<Block Diagram of the Decoding Apparatus>

Figure 17:
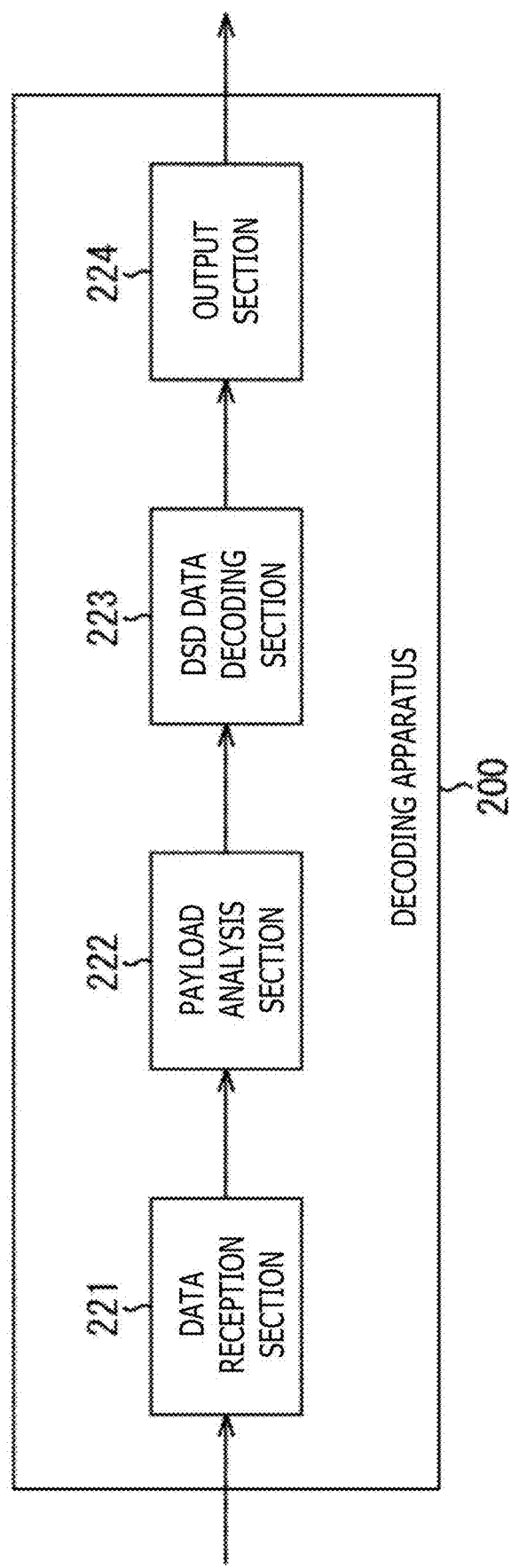
FIG. 17 is a block diagram illustrating a configuration example of a decoding apparatus according to the present disclosure.

FIG. 17 is a block diagram illustrating a configuration example of a decoding apparatus according to the present disclosure.

A decoding apparatus 200 illustrated in FIG. 17 is an apparatus that receives a DSD lossless stream received from the compression/encoding apparatus 100 in FIG. 1 and reversibly decodes the DSD lossless stream through a decoding scheme corresponding to the compression/encoding scheme of the compression/encoding apparatus 100.

The decoding apparatus 200 includes a data reception section 221, a payload analysis section 222, a DSD data decoding section 223, and an output section 224.

The data reception section 221 receives a DSD lossless stream transmitted from the compression/encoding apparatus 100 via a network such as the internet, a telephone line network, a satellite communication network, a LAN (Local Area Network), or a WAN (Wide Area Network). The DSD lossless stream is transmitted, for example, in a format compliant with the MPEG-DASH standard.

In MPEG-DASH, a plurality of pieces of encoded data representing the same piece of content with different bitrates are held in a content server so that client apparatuses can receive desired encoded data through streaming from among the plurality of pieces of encoded data to match the network communication capacity.

For this reason, the data reception section 221 may request the content server holding the DSD lossless stream with the plurality of bitrates generated by the compression/encoding apparatus 100 to transmit (deliver) the DSD lossless stream with a given bitrate, and in response to the request, the content server may receive the given DSD lossless stream from the content server.

The data reception section 221 acquires DSD lossless payloads included in the DSD lossless stream and outputs the DSD lossless payloads to the payload analysis section 222.

The payload analysis section 222 analyzes the DSD lossless payloads supplied from the data reception section 221 and outputs the extracted data to the DSD data decoding section 223. More specifically, the payload analysis section 222 detects the number of channels of the DSD data included in the DSD lossless payload, the sampling frequency, the number of blocks, and so on, extracts the data in each block from Block1 to Block10, the data of the conversion table table1 used for compression and encoding thereof, and so on, and outputs these pieces of data to the DSD data decoding section 223.

The DSD data decoding section 223 decodes the data in each block from Block1 to Block10 supplied from the payload analysis section 222 through a decoding scheme corresponding to the compression/encoding scheme of the compression/encoding apparatus 100, thereby restoring the DSD data. More specifically, in the case where the data in each block from Block1 to Block10 are compressed data, the DSD data decoding section 223 decodes the data by using the conversion table table1. In the case where the data in each block from Block1 to Block10 are uncompressed data, the DSD data decoding section 223 outputs the block data in an 'as-is' manner.

The output section 224 includes, for example, an LPF (low pass filter), a power amplifier, a speaker, and so on, performs a given filtering process such as LPF-based filtering on the decoded data supplied from the DSD data decoding section 223, amplifies the data, and then outputs the data as a sound.

<Configuration Example of the DSD Data Decoding Section>

Figure 18:
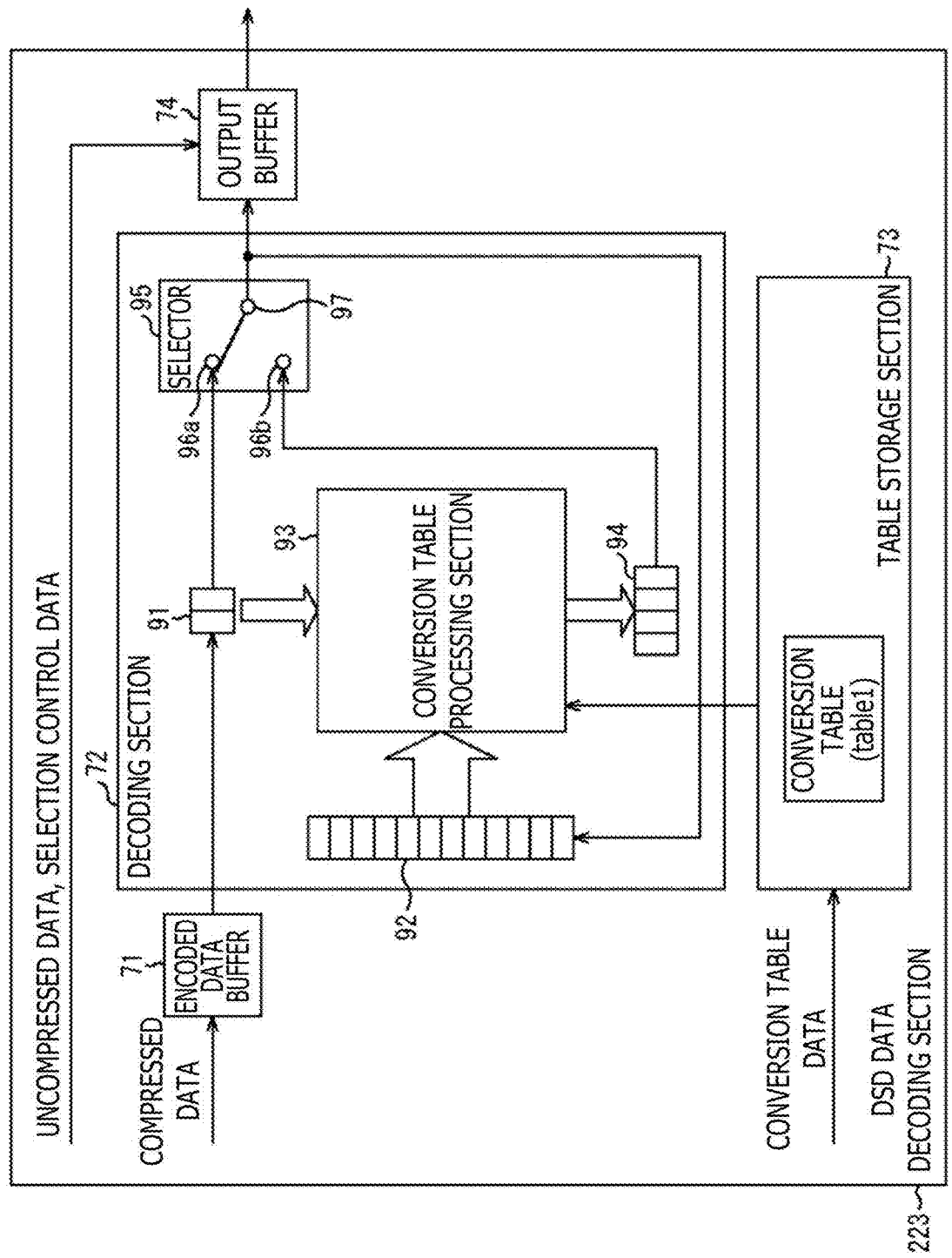
FIG. 18 is a block diagram illustrating a detailed configuration of a DSD data decoding section.

FIG. 18 is a block diagram illustrating a detailed configuration of the DSD data decoding section 223.

The DSD data decoding section 223 includes an encoded data buffer 71, a decoding section 72, a table storage section 73, and an output buffer 74.

The compressed data in each block from Block1 to Block10 extracted by the payload analysis section 222 are supplied to the encoded data buffer 71. Uncompressed data and selection control data are supplied to the output buffer 74. The data of the conversion table table1 are supplied to the table storage section 73.

The table storage section 73 stores the conversion table table1 supplied from the payload analysis section 222 and supplies the table to the decoding section 72 as necessary.

The encoded data buffer 71 temporarily accumulates the compressed data supplied from the payload analysis section 222 and supplies the compressed data to the decoding section 72 at the subsequent stage at a given timing.

The decoding section 72 decodes the compressed data back to its original form before the compression (reversibly decodes the data) and supplies the data to the output buffer 74.

A description will be given of the decoding method used by the decoding section 72.

A case will be described in which compressed data sent from the compression/encoding apparatus 100 after compression and encoding are expressed, two bits by two bits, as depicted below and in which E2[n] is decoded.

... E2[n−3], E2[n−2], E2[n−1], E2[n], E2[n+1], E2[n+2], E2[n+3], ....

where E2[n] represents two-bit continuous data and will also be referred to as E2 data.

The decoding section 72 decides the value of E2[n] first.

In the case where E2[n] is "00b," this data are not included in the received conversion table table1[4096][3]. Therefore, "E2[n+1]+E2[n+2]," the four-bit data following E2[n] are the data to be decoded.

On the other hand, in the case where E2[n] is "01b," "10b," or "11b," this data are included in the received conversion table table1[4096][3]. Therefore, the decoding section 72 makes a search to find the data to be decoded by referring to the received conversion table table1[4096][3] by using D4[n−3], D4[n−2], D4[n−1], the 12-bit D4 data decoded immediately previously. The data to be decoded are the data held in "table1[D4[n−3], D4[n−2], D4[n−1]][E2[n]-1]."

As described above, the decoding section 72 can decode the compressed data back to its original form before the compression (reversibly decode the data).

As illustrated in FIG. 18, the decoding section 72 includes a two-bit register 91, a 12-bit register 92, a conversion table processing section 93, a four-bit register 94, and a selector 95.

Two-bit E2 data (e.g., E2[n]) supplied from the encoded data buffer 71 are stored in the register 91.

The output of the selector 95 is supplied to the 12-bit register 92, and the register 92 holds the 12-bit data (e.g., D4[n−3], D4[n−2], D4[n−1]) that were decoded immediately before the two-bit E2 data (e.g., E2[n]) that are stored in the register 91.

In the case where the two-bit E2 data (e.g., E2[n]) stored in the register 91 are "00b," the selector 95 selects an input terminal 96*a* and outputs "E2[n+1]+E2[n+2]," the four-bit data following E2[n], as a decoding result from an output terminal 97.

The two-bit E2 data (e.g., E2[n]) stored in the register 91 are "01b," "10b," or "11b," the conversion table processing section 93 stores, in the register 94, four-bit data held in "table1[D4[n−3], D4[n−2], D4[n−1]][E2[n]-1]" of the conversion table table1 supplied from the table storage section 73. The selector 95 selects an input terminal 96*b* and outputs the data stored in the register 94 as a decoding result from an output terminal 97.

The output buffer 74 selects either the uncompressed data supplied from the payload analysis section 222 or the decoded data supplied from the decoding section 72 as appropriate on the basis of selection control data and outputs the selected data to the output section 224 at the subsequent stage.

<Flow of the GOB Data Decoding Process>

Figure 19:
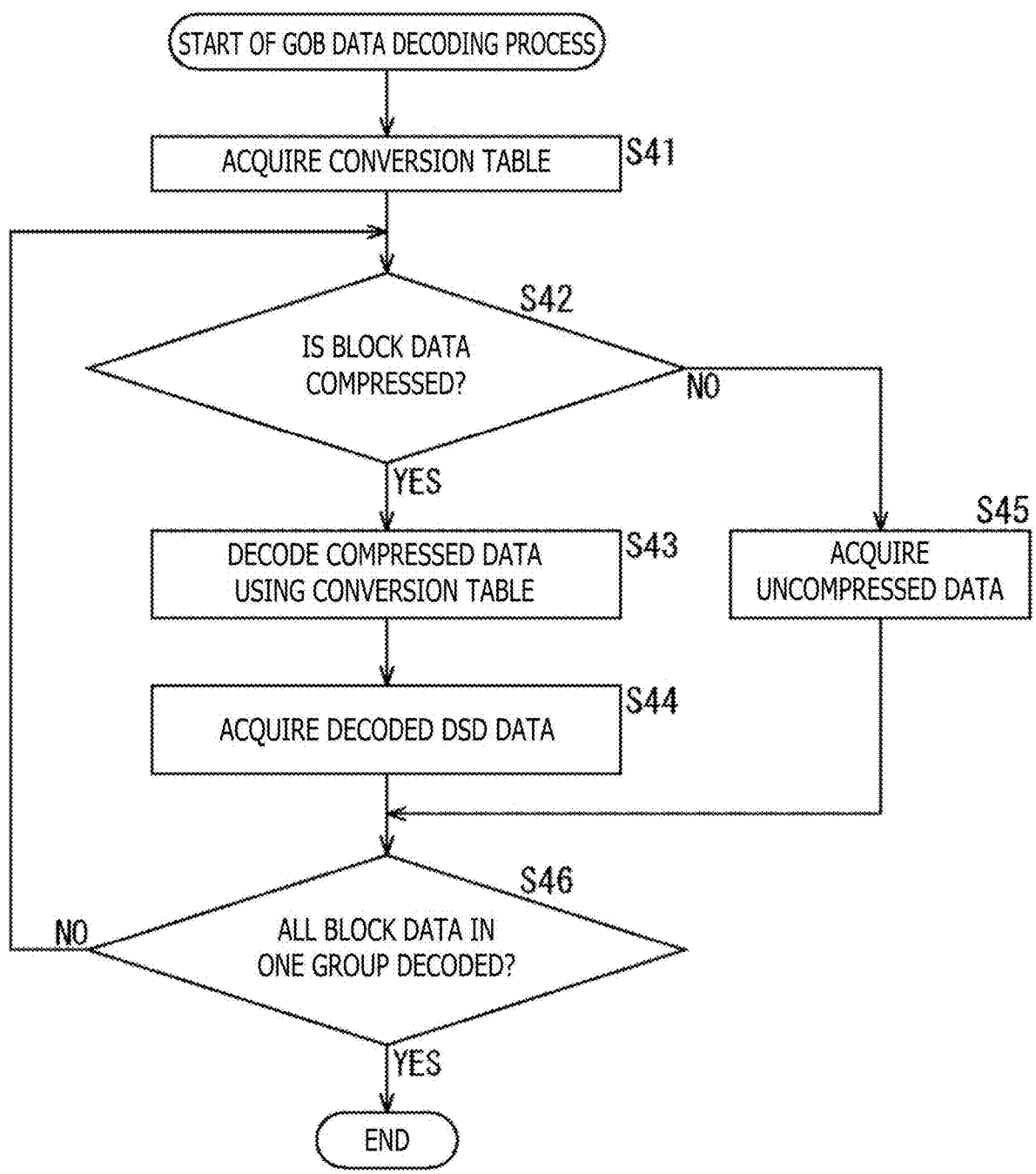
FIG. 19 is a flowchart describing a GOB data decoding process.

A description will be given of a GOB data decoding process handled by the DSD data decoding section 223 with reference to the flowchart illustrated in FIG. 19.

First, in step S41, the table storage section 73 acquires the conversion table table1 supplied from the payload analysis section 222 and stores the conversion table table1. The stored conversion table table1 is supplied to the decoding section 72 as necessary.

In step S42, the output buffer 74 decides, on the basis of the selection control data supplied from the payload analysis section 222, whether a given block of data supplied from the payload analysis section 222 is compressed data that have been compressed and encoded.

In the case where it is decided, in step S42, that the given block of data is compressed data, the process proceeds to step S43, and the decoding section 72 decodes the compressed data supplied from the encoded data buffer 71 by using the conversion table table1 and supplies the decoded data to the output buffer 74. That is, the decoding section 72 performs, on a block of data, a process of supplying "E2[n+1]+E2[n+2]," the four-bit data following E2[n], to the output buffer 74 as a decoding result in the case where the two-bit E2 data (e.g., E2[n]) are "00b" and supplying, to the output buffer 74, the four-bit data held in "table1[D4[n−3], D4[n−2], D4[n−1]][E2[n]-1]" of the conversion table table1 as a decoding result in the case where the two-bit E2 data (e.g., E2[n]) are "01b," "10b," or "11b."

In step S44, the output buffer 74 acquires the decoded DSD data supplied from the decoding section 72 and outputs the decoded DSD data to the output section 224 at the subsequent stage.

On the other hand, in the case where it is decided in step S42 that the given block of data is not compressed data, the process proceeds to step S45, and the output buffer 74 acquires uncompressed data (uncompressed DSD data) supplied from the payload analysis section 222 and outputs the uncompressed data to the output section 224 at the subsequent stage.

In step S46, the DSD data decoding section 223 decides whether all the block data of a group (GOB) included in a DSD lossless payload have been decoded.

In the case where it is decided in step S46 that all the block data of the group (GOB) have yet to be decoded, the process returns to step S42, and the above processes in steps S42 to S46 are repeated. Steps S42 to S45 are performed for each of the 10 blocks (Block1 to Block10).

On the other hand, in the case where it is decided in step S46 that all the block data of the group (GOB) have been decoded, the DSD data decoding section 223 terminates the GOB data decoding process.

<Flow of the DSD Data Reception Process>

Figure 20:
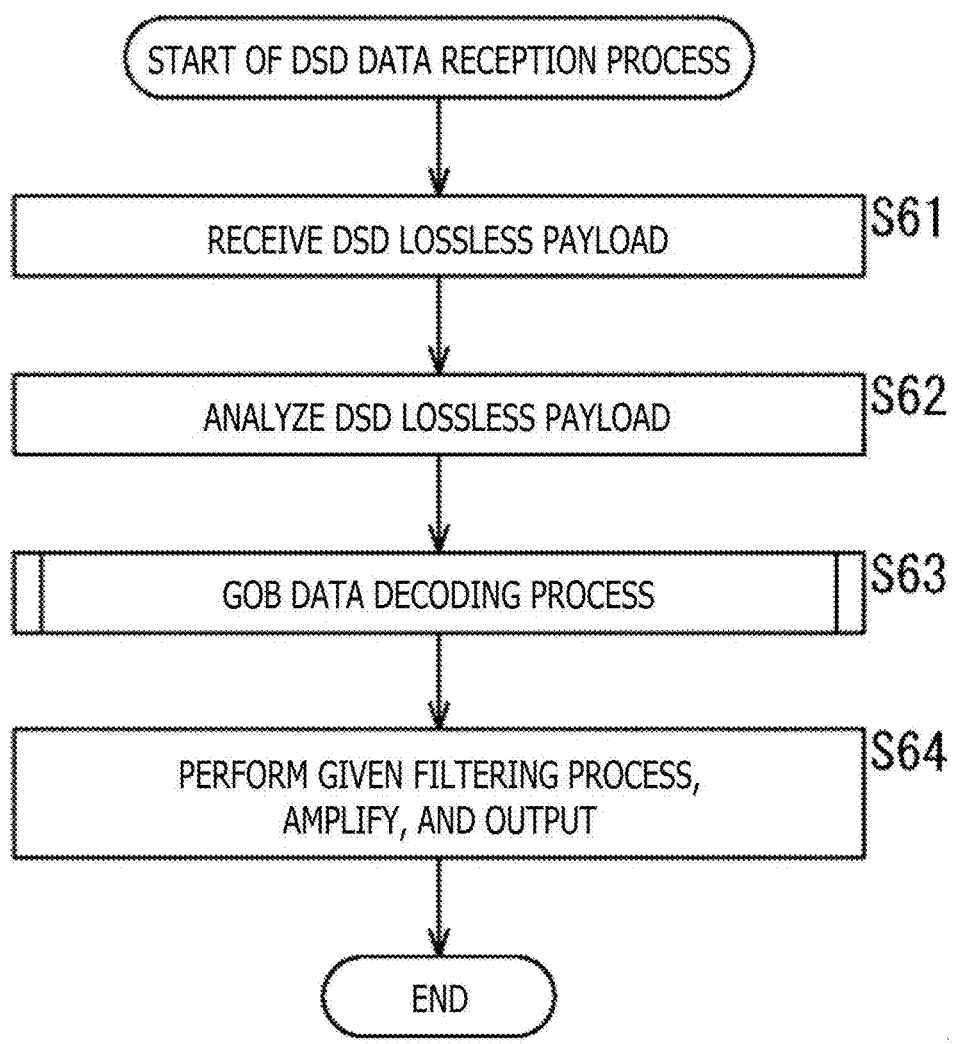
FIG. 20 is a flowchart describing a DSD data reception process.

A description will be given next of a DSD data reception process, a process handled by the decoding apparatus 200 as a whole illustrated in FIG. 17, with reference to the flowchart illustrated in FIG. 20.

In step S61, the data reception section 221 acquires DSD lossless payloads included in a DSD lossless stream and outputs the DSD lossless payloads to the payload analysis section 222.

In step S62, the payload analysis section 222 analyzes the DSD lossless payloads supplied from the data reception section 221 and outputs the extracted data to the DSD data decoding section 223.

In step S63, the DSD data decoding section 223 performs a GOB data decoding process of decoding the data supplied from the payload analysis section 222 through a decoding scheme corresponding to the compression/encoding scheme of the compression/encoding apparatus 100. That is, the DSD data decoding section 223 performs the processes described with reference to the flowchart illustrated in FIG. 19.

In step S64, the output section 224 performs a given filtering process such as LPF-based filtering on the decoded data supplied from the DSD data decoding section 223, amplifies the data, and then outputs the data as a sound.

The above processes in steps S61 to S64 are repeated each time the decoding apparatus 200 receives DSD lossless payloads.

As described above, the decoding apparatus 200 illustrated in FIG. 17 includes the data reception section 221 and the decoding section 72. The data reception section 221 acquires, as a data acquisition section, compressed GOB data that include the conversion table table1 and compressed data or uncompressed data. The conversion table table1 was used for encoding GOB data that include a group of DSD data (digital data) including a plurality of blocks by treating a frame of delta-sigma-modulated digital data as a block. Compressed data have been obtained by compressing and encoding the DSD data in each block of the GOB data by using the conversion table table1. The decoding section 72 decodes, in the case where the DSD data in each block of the compressed GOB data are compressed data, the compressed data by using the conversion table table1.

Also, the compressed GOB data include selection control data indicating whether the DSD data in each block of the compressed GOB data are compressed or uncompressed, and the decoding apparatus 200 further includes the output buffer 74 that selects, as a selection section and on the basis of selection control data, the uncompressed data included in the compressed GOB data or the DSD data decoded by the decoding section 72 and outputs the selected data.

Further, the decoding apparatus 200 further includes the payload analysis section 222 that extracts the conversion table table1 and compressed data or uncompressed data by analyzing the acquired compressed GOB data as a data analysis section.

According to the decoding apparatus 200 illustrated in FIG. 17, it is possible to acquire, decode and output a DSD lossless stream, which is provided by the compression/encoding apparatus 100, obtained by lossless compression/encoding of DSD data with a higher compression ratio.

According to the compression/encoding apparatus 100 and the decoding apparatus 200, it is possible to reduce the communication capacity and stably receive DSD signal content through streaming.

Also, it is possible to dynamically select and view DSD signals of better quality to match with the communication line capacity through transmission and reception of content between the compression/encoding apparatus 100 and the decoding apparatus 200 in a stream delivery format compliant with the MPEG-DASH (Moving Picture Experts Group phase—Dynamic Adaptive Streaming over HTTP) standard.

According to the DSD lossless stream format described above, it is possible to deal with fading and other problems and take remedies against errors because of appropriate block-by-block communication.

It should be noted that, in the embodiment described above, a case was described in which compression and encoding of a digital signal (DSD data) delta-sigma-modulated by the DSD data generation section 121 was achieved by converting four bits into a two-bit code by using the data conversion table table1 based on data occurrence frequency.

However, the compression/encoding apparatus 100 can achieve compression and encoding, for example, by converting four bits into a one-bit code or eight bits into a four-bit code. The decoding apparatus 200 can also perform a decompression process (reversible decoding) on a code that has been compressed and encoded by the compression/encoding apparatus 100.

For example, in the case where four bits are converted into a one-bit code, the register 54 of the encoding section 32 illustrated in FIG. 5 is changed to a one-bit storage. Also, the register 91 of the decoding section 72 illustrated in FIG. 18 is changed to a one-bit storage.

For example, in the case where eight bits are converted into a four-bit code, the register 51 of the encoding section 32 illustrated in FIG. 5 is changed to an eight-bit storage, and the register 54 is changed to a four-bit storage. Also, the register 91 of the decoding section 72 illustrated in FIG. 18 is changed to a four-bit storage, and the register 94 is changed to an eight-bit storage.

Therefore, the compression/encoding apparatus 100 can include the encoding section 32 that converts an M-bit delta-sigma-modulated digital signal into N bits (M>N) by referring to the conversion table table1. Here, letting the number of N-bit bit patterns be denoted by P, the conversion table table1 stores the upper (P−1) codes in terms of occurrence frequency in the past bit patterns.

Also, the decoding apparatus 200 can include the decoding section 72 that converts and decodes N bits of encoded data, obtained by compressing and encoding an M-bit delta-sigma-modulated digital signal into N bits (M>N), into M bits by referring to the conversion table table1.

<3. Computer Configuration Example>

The series of processes described above may be performed by hardware or software. The compression/decompression method of the present disclosure is low in terms of volume of software-based processing handled by the CPU (Central Processing Unit), making the compression/decompression method immune to whether equipment has high processing capability. This ensures low dependence on models of mobile terminals and stationary equipment.

In the case where the series of processes described above are performed by software, the program included in the software is installed to a computer. Here, the computer includes a computer incorporated in dedicated hardware, a general-purpose personal computer capable of performing various functions as a result of installation of various programs, and so on.

Figure 21:
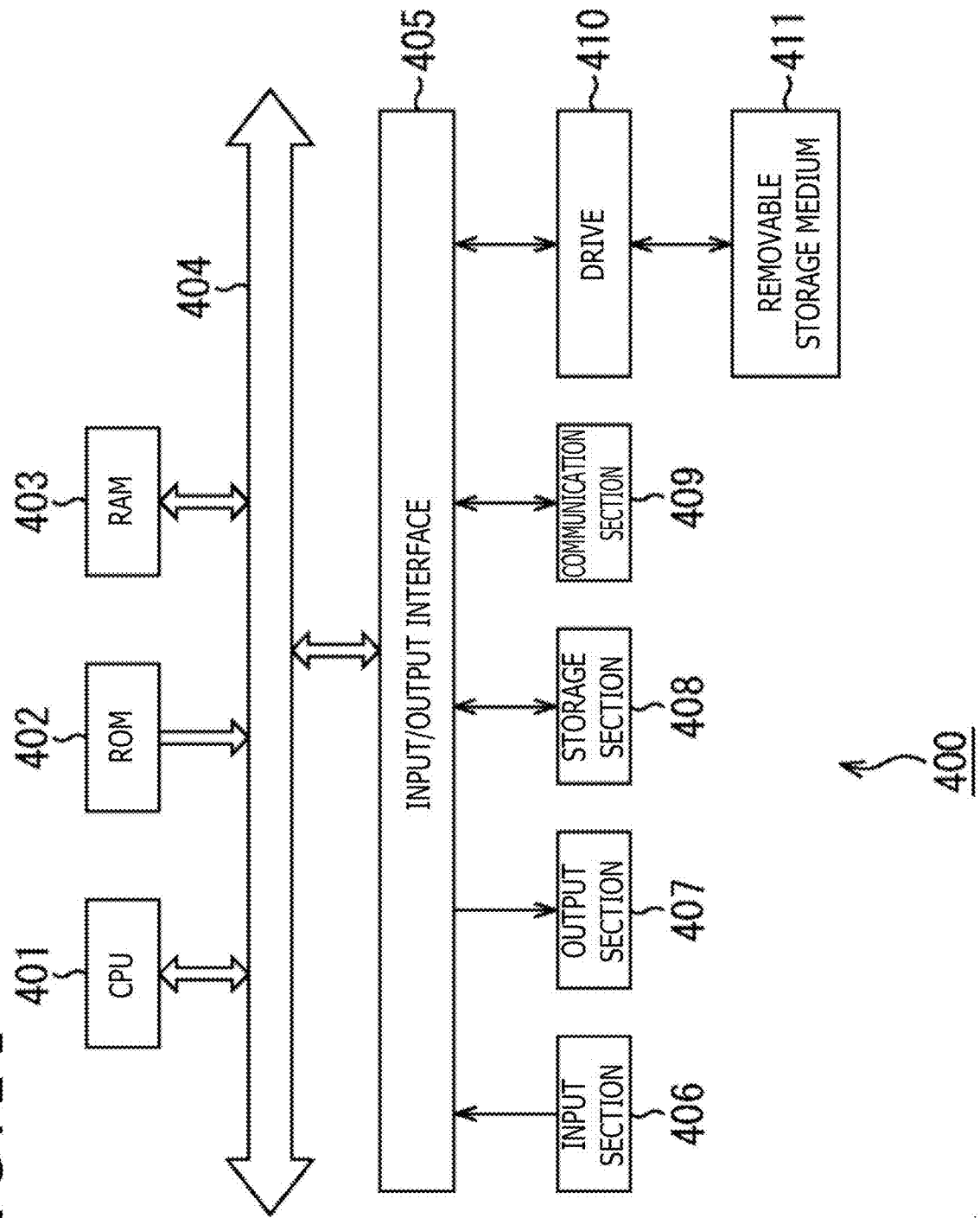
FIG. 21 is a block diagram illustrating a configuration example of an embodiment of a computer to which the present technology is applied.

FIG. 21 is a block diagram illustrating a hardware configuration example of a computer that performs the series of processes described above by using a program.

In a computer 400 illustrated in FIG. 21, a CPU 401, a ROM (Read Only Memory) 402, and a RAM (Random Access Memory) 403 are connected to each other by a bus 404.

An input/output interface 405 is further connected to the bus 404. An input section 406, an output section 407, a storage section 408, a communication section 409, and a drive 410 are connected to the input/output interface 405.

The input section 406 includes a keyboard, a mouse, a microphone, and so on. The output section 407 includes a display, a speaker, and so on. The storage section 408 includes a hard disk, a non-volatile memory, and so on. The communication section 409 includes a network interface and so on. The drive 410 drives a removable recording medium 411 such as magnetic disk, optical disc, magneto-optical disk, or semiconductor memory.

In the computer 400 configured as described above, the CPU 401 performs the above series of processes, for example, by loading the program stored in the storage section 408 into the RAM 403 via the input/output interface 405 and bus 404 for execution.

In the computer 400, the program can be installed to the storage section 408 via the input/output interface 405 by inserting the removable medium 411 into the drive 410. Also, the program can be received by the communication section 409 via a wired or wireless transmission medium such as a local area network, the Internet, or digital satellite broadcasting and installed to the storage section 408. In addition to the above, the program can be installed, in advance, to the ROM 402 or storage section 408.

It should be noted that the program executed by the computer 400 may perform the processes chronologically according to the sequence described in the present specification, or in parallel, or at a necessary time as when the program is called.

It should be noted that embodiments of the present disclosure are not limited to those described above and can be modified in various ways without departing from the gist of the present disclosure.

For example, an embodiment can be adopted in which all or some of the plurality of embodiments described above are combined.

For example, the present disclosure can have a cloud computing configuration in which one function is processed by a plurality of apparatuses via a network in a shared and cooperative manner.

Also, each of the steps described in the above flowcharts can be performed not only by a single apparatus but also by a plurality of apparatuses in a shared manner.

Further, in the case where one step includes a plurality of processes, the plurality of processes included in that step can be performed not only by a single apparatus but also by a plurality of apparatuses in a shared manner.

It should be noted that the effects described in the present specification are merely illustrative and are not restrictive and that there may be effects other than those described in the present specification.

It should be noted that the present technology can also have the following configurations:

(1)
A compression/encoding apparatus including:
a GOB data configuration section adapted to configure GOB data with a group of digital data that includes a plurality of blocks by treating a frame of delta-sigma-modulated digital data as a block;
a table generation section adapted to generate a conversion table for encoding the GOB data; and
an encoding section adapted to compress and encode the digital data of each block included in the GOB data by using the conversion table.

(2)
The compression/encoding apparatus of feature (1) further including:
a compression decision section adapted to decide, block by block, the degree of compression of compressed data compressed and encoded by the encoding section; and
a payload generation section adapted to generate compressed GOB data that adopt the digital data that have yet to be compressed and encoded for a block whose degree of compression is greater than that of the digital data before the compression and encoding and adopt the compressed data that have been compressed and encoded for a block whose degree of compression is equal to or smaller than that of the digital data before the compression and encoding.

(3)
The compression/encoding apparatus of feature (2) further including:
a data transmission section adapted to transmit the conversion table and the compressed GOB data applied the conversion table.

(4)
The compression/encoding apparatus of any one of features (1) to (3), in which
the encoding section converts M-bit delta-sigma-modulated digital data into N bits (M>N) by referring to the conversion table, and
letting the number of N-bit bit patterns be denoted by P, the conversion table stores upper (P−1) codes in terms of occurrence frequency in past bit patterns.

(5)
A compression/encoding method including:
a step in which a compression/encoding apparatus configures GOB data with a group of digital data that includes a plurality of blocks by treating a frame of delta-sigma-modulated digital data as a block;
a step in which the compression/encoding apparatus generates a conversion table for encoding the GOB data; and
a step in which the compression/encoding apparatus compresses and encodes the digital data of each block included in the GOB data by using the conversion table.

(6)
A program causing a computer to function as:
a GOB data configuration section adapted to configure GOB data with a group of digital data that includes a plurality of blocks by treating a frame of delta-sigma-modulated digital data as a block;
a table generation section adapted to generate a conversion table for encoding the GOB data; and
an encoding section adapted to compress and encode the digital data of each block included in the GOB data by using the conversion table.

(7)
A decoding apparatus including:
a data acquisition section adapted to acquire compressed GOB data that include a conversion table and compressed data or uncompressed data, the conversion table having been used for encoding GOB data that include a group of digital data including a plurality of blocks by treating a frame of delta-sigma-modulated digital data as a block, the compressed data having been obtained by compressing and encoding the digital data in each block of the GOB data by using the conversion table; and
a decoding section adapted to decode, in the case where the digital data in each block of the compressed GOB data are the compressed data, the compressed data by using the conversion table.

(8)
The decoding apparatus of feature (7), in which
the compressed GOB data include selection control data indicating whether the digital data in each block of the GOB data are the compressed data or the uncompressed data, the decoding apparatus further including:
a selection section adapted to select and output, on the basis of the selection control data, the uncompressed data included in the compressed GOB data or the digital data obtained by decoding by the decoding section.

(9)
The decoding apparatus of feature (7) or (8) further including:
a data analysis section adapted to extract the conversion table and the compressed data or the uncompressed data by analyzing the acquired compressed GOB data.

(10)
The decoding apparatus of any one of features (7) to (9), in which
the decoding section converts N bits of the compressed data, obtained by compressing and encoding M-bit delta-sigma-modulated digital data into N bits (M>N), into the M bits by referring to the conversion table, and
letting the number of N-bit bit patterns be denoted by P, the conversion table stores upper (P−1) codes in terms of occurrence frequency in past bit patterns.

(11)
A decoding method including:
a step in which a decoding apparatus acquires compressed GOB data that include a conversion table and compressed data or uncompressed data, the conversion table having been used for encoding GOB data that include a group of digital data including a plurality of blocks by treating a frame of delta-sigma-modulated digital data as a block, the compressed data having been obtained by compressing and encoding the digital data in each block of the GOB data by using the conversion table; and
a step in which the decoding apparatus decodes, in the case where the digital data in each block of the compressed GOB data are the compressed data, the compressed data by using the conversion table.

(12)
A program causing a computer to function as:
a data acquisition section adapted to acquire compressed GOB data that include a conversion table and compressed data or uncompressed data, the conversion table having been used for encoding GOB data that include a group of digital data including a plurality of blocks by treating a frame of delta-sigma-modulated digital data as a block, the compressed data having been obtained by compressing and encoding the digital data in each block of the GOB data by using the conversion table; and
a decoding section adapted to decode, in the case where the digital data in each block of the compressed GOB data are the compressed data, the compressed data by using the conversion table.

REFERENCE SIGNS LIST

31 Control section
32 Encoding section
34 Data volume comparison section
72 Decoding section
73 Table storage section
74 Output buffer
100 Compression/encoding apparatus
121 DSD data generation section
122 GOB data configuration section
123 DSD data encoding section
124 Payload generation section
125 Data transmission section
200 Decoding apparatus
221 Data reception section
222 Payload analysis section
223 DSD data decoding section
224 Output section
400 Computer
401 CPU
402 ROM
403 RAM
406 Input section
407 Output section
408 Storage section
409 Communication section
410 Drive

The invention claimed is:

1. A compression/encoding apparatus comprising:
   a GOB (Group of Blocks) data configuration section adapted to configure GOB data with a group of digital data that includes a plurality of blocks by treating a frame of delta-sigma-modulated digital data as a block;
   a table generation section adapted to generate a conversion table for encoding the GOB data, wherein the conversion table is generated based on the GOB data; and
   an encoding section adapted to compress and encode the digital data of each block included in the GOB data by using the conversion table.

2. The compression/encoding apparatus of claim 1, further comprising:
   a compression decision section adapted to decide, block by block, a degree of compression of compressed data compressed and encoded by the encoding section; and
   a payload generation section adapted to generate compressed GOB data that adopt the digital data that have yet to be compressed and encoded for a block whose degree of compression is greater than that of the digital data before the compression and encoding and adopt the compressed data that have been compressed and encoded for a block whose degree of compression is equal to or smaller than that of the digital data before the compression and encoding.

3. The compression/encoding apparatus of claim 2, further comprising:
   a data transmission section adapted to transmit the conversion table and the compressed GOB data applied the conversion table.

4. The compression/encoding apparatus of claim 1, wherein
   the encoding section converts M-bit delta-sigma-modulated digital data into N bits (M>N) by referring to the conversion table, and
   letting the number of N-bit bit patterns be denoted by P, the conversion table stores upper (P−1) codes in terms of occurrence frequency in past bit patterns.

5. A compression/encoding method comprising:
   a step in which a compression/encoding apparatus configures GOB (Group of Blocks) data with a group of digital data that includes a plurality of blocks by treating a frame of delta-sigma-modulated digital data as a block;
   a step in which the compression/encoding apparatus generates a conversion table for encoding the GOB data, wherein the conversion table is generated based on the GOB data; and
   a step in which the compression/encoding apparatus compresses and encodes the digital data of each block included in the GOB data by using the conversion table.

6. A non-transitory computer readable medium storing computer readable instructions that, when executed by a computer, implement:
   a GOB (Group of Blocks) data configuration section adapted to configure GOB data with a group of digital data that includes a plurality of blocks by treating a frame of delta-sigma-modulated digital data as a block;
   a table generation section adapted to generate a conversion table for encoding the GOB data, wherein the conversion table is generated based on the GOB data; and
   an encoding section adapted to compress and encode the digital data of each block included in the GOB data by using the conversion table.

7. A decoding apparatus comprising:
   a data acquisition section adapted to acquire compressed GOB (Group of Blocks) data that include a conversion table and compressed data or uncompressed data, the conversion table having been generated based on the GOB data and having been used for encoding GOB data that include a group of digital data including a plurality of blocks by treating a frame of delta-sigma-modulated digital data as a block, the compressed data having been obtained by compressing and encoding the digital data in each block of the GOB data by using the conversion table; and
   a decoding section adapted to decode, in a case where the digital data in each block of the compressed GOB data are the compressed data, the compressed data by using the conversion table.

8. The decoding apparatus of claim 7, wherein
   the compressed GOB data include selection control data indicating whether the digital data in each block of the GOB data are the compressed data or the uncompressed data, the decoding apparatus further comprising:
   a selection section adapted to select and output, on a basis of the selection control data, the uncompressed data included in the compressed GOB data or the digital data obtained by decoding by the decoding section.

9. The decoding apparatus of claim 7, further comprising:
   a data analysis section adapted to extract the conversion table and the compressed data or the uncompressed data by analyzing the acquired compressed GOB data.

10. The decoding apparatus of claim 7, wherein
    the decoding section converts N bits of the compressed data, obtained by compressing and encoding M-bit delta-sigma-modulated digital data into N bits (M>N), into the M bits by referring to the conversion table, and letting the number of N-bit bit patterns be denoted by P, the conversion table stores upper (P−1) codes in terms of occurrence frequency in past bit patterns.

11. A decoding method comprising:
a step in which a decoding apparatus acquires compressed GOB (Group of Blocks) data that include a conversion table and compressed data or uncompressed data, the conversion table having been generated based on the GOB data and having been used for encoding GOB data that include a group of digital data including a plurality of blocks by treating a frame of delta-sigma-modulated digital data as a block, the compressed data having been obtained by compressing and encoding the digital data in each block of the GOB data by using the conversion table; and
a step in which the decoding apparatus decodes, in a case where the digital data in each block of the compressed GOB data are the compressed data, the compressed data by using the conversion table.

12. A non-transitory computer readable medium storing computer readable instructions that, when executed by a computer, implement:
a data acquisition section adapted to acquire compressed GOB (Group of Blocks) data that include a conversion table and compressed data or uncompressed data, the conversion table having been generated based on the GOB data and having been used for encoding GOB data that include a group of digital data including a plurality of blocks by treating a frame of delta-sigma-modulated digital data as a block, the compressed data having been obtained by compressing and encoding the digital data in each block of the GOB data by using the conversion table; and
a decoding section adapted to decode, in a case where the digital data in each block of the compressed GOB data are the compressed data, the compressed data by using the conversion table.

* * * * *